United States Patent
Kobayashi et al.

(10) Patent No.: US 9,978,770 B2
(45) Date of Patent: May 22, 2018

(54) SEMICONDUCTOR MEMORY DEVICE

(71) Applicant: Toshiba Memory Corporation, Minato-ku (JP)

(72) Inventors: Shigeki Kobayashi, Kuwana (JP); Atsushi Konno, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/257,237

(22) Filed: Sep. 6, 2016

(65) Prior Publication Data

US 2017/0243883 A1 Aug. 24, 2017

Related U.S. Application Data

(60) Provisional application No. 62/298,247, filed on Feb. 22, 2016.

(51) Int. Cl.
*H01L 27/115* (2017.01)
*H01L 27/11582* (2017.01)
*H01L 29/10* (2006.01)
*H01L 27/11556* (2017.01)
*H01L 27/11524* (2017.01)
(Continued)

(52) U.S. Cl.
CPC .... *H01L 27/11582* (2013.01); *H01L 23/5226* (2013.01); *H01L 27/1157* (2013.01); *H01L 27/11524* (2013.01); *H01L 27/11556* (2013.01); *H01L 29/1087* (2013.01)

(58) Field of Classification Search
CPC ......... H01L 27/11582; H01L 27/11524; H01L 23/5226; H01L 27/1157; H01L 27/11556; H01L 29/1087

USPC .......................................................... 257/314
See application file for complete search history.

(56) References Cited

U.S. PATENT DOCUMENTS 3,841,927 A * 10/1974 Florence ............ H01L 21/2225
                                                            252/951
8,946,023 B2   2/2015 Makala et al.
8,963,230 B2   2/2015 Imamura et al.
(Continued)

FOREIGN PATENT DOCUMENTS

JP       2012-119445      6/2012

*Primary Examiner* — Marc Armand
*Assistant Examiner* — Sue Tang
(74) *Attorney, Agent, or Firm* — Oblon, McClelland, Maier & Neustadt, L.L.P.

(57) ABSTRACT

According to an embodiment, a semiconductor memory device comprises a substrate, a plurality of first conductive layers, a memory columnar body, a first semiconductor layer, a second semiconductor layer and a contact. The plurality of first conductive layers are stacked upwardly of the substrate. The memory columnar body extends in a first direction intersecting an upper surface of the substrate and a side surface of the memory columnar body is covered by the first conductive layers. The first semiconductor layer is connected to a lower end of the memory columnar body and extends in a second direction intersecting the first direction. The second conductive layer is provided between the first semiconductor layer and the first conductive layers. The second conductive layer is connected to the memory columnar body and extending in the second direction. The contact is connected to the second conductive layer and extends in the first direction.

28 Claims, 30 Drawing Sheets

(51) Int. Cl.
*H01L 27/1157* (2017.01)
*H01L 23/522* (2006.01)

(56) References Cited

U.S. PATENT DOCUMENTS

| | | |
|---|---|---|
| 9,023,702 B2 | 5/2015 | Lee |
| 2012/0098139 A1* | 4/2012 | Chae ................ H01L 27/11582 |
| | | 257/773 |
| 2013/0248974 A1* | 9/2013 | Alsmeier ............... G11C 16/04 |
| | | 257/321 |
| 2013/0286735 A1 | 10/2013 | Hwang et al. |
| 2016/0233224 A1* | 8/2016 | Rhie ................ H01L 27/11582 |

* cited by examiner

SEMICONDUCTOR MEMORY DEVICE

CROSS-REFERENCE TO RELATED APPLICATIONS

This application is based upon and claims the benefit of U.S. Provisional Patent Application No. 62/298,247, filed on Feb. 22, 2016, the entire contents of which are incorporated herein by reference.

FIELD

Embodiments described herein relate to a semiconductor memory device.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

A semiconductor memory device according to an embodiment comprises a substrate, a plurality of first conductive layers, a memory columnar body, a first semiconductor layer, a second semiconductor layer and a contact. The plurality of first conductive layers are stacked upwardly of the substrate. The memory columnar body extends in a first direction intersecting an upper surface of the substrate and a side surface of the memory columnar body is covered by the plurality of first conductive layers. The first semiconductor layer is connected to a lower end of the memory columnar body. The first semiconductor layer extends in a second direction intersecting the first direction. The second conductive layer is provided between the first semiconductor layer and the plurality of first conductive layers. The second conductive layer is connected to the memory columnar body and extending in the second direction. The contact is connected to the second conductive layer. The contact extends in the first direction.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below comprise a plurality of memory cells (memory transistors) arranged in a first direction intersecting an upper surface of a substrate. These memory cells include: a semiconductor layer extending in the above-described first direction and functioning as a channel body; and a control gate electrode provided on a side surface of the semiconductor layer via a gate insulating layer.

These plurality of memory cells configure a memory string. One memory string may include one semiconductor layer, or may include two or more semiconductor layers joined at one ends (lower ends) thereof.

In addition, the above-described memory cell may be a MONOS (Metal-Oxide-Nitride-Oxide-Semiconductor) type memory cell that includes a charge accumulation layer configured from a nitride and a control gate electrode made of a metal, or may be a SONOS (Semiconductor-Oxide-Nitride-Oxide-Semiconductor) type memory cell that includes a control gate electrode made of a semiconductor.

Moreover, the above-described gate insulating layer may include a floating gate, not a charge accumulation layer configured from a nitride. With regard to an example of the memory cell having a floating gate, reference is made to the U.S. patent application Ser. No. 13/112,345 whose disclosure content is herewith incorporated by this reference.

First Embodiment

[Semiconductor Memory Device]

Figure 1:
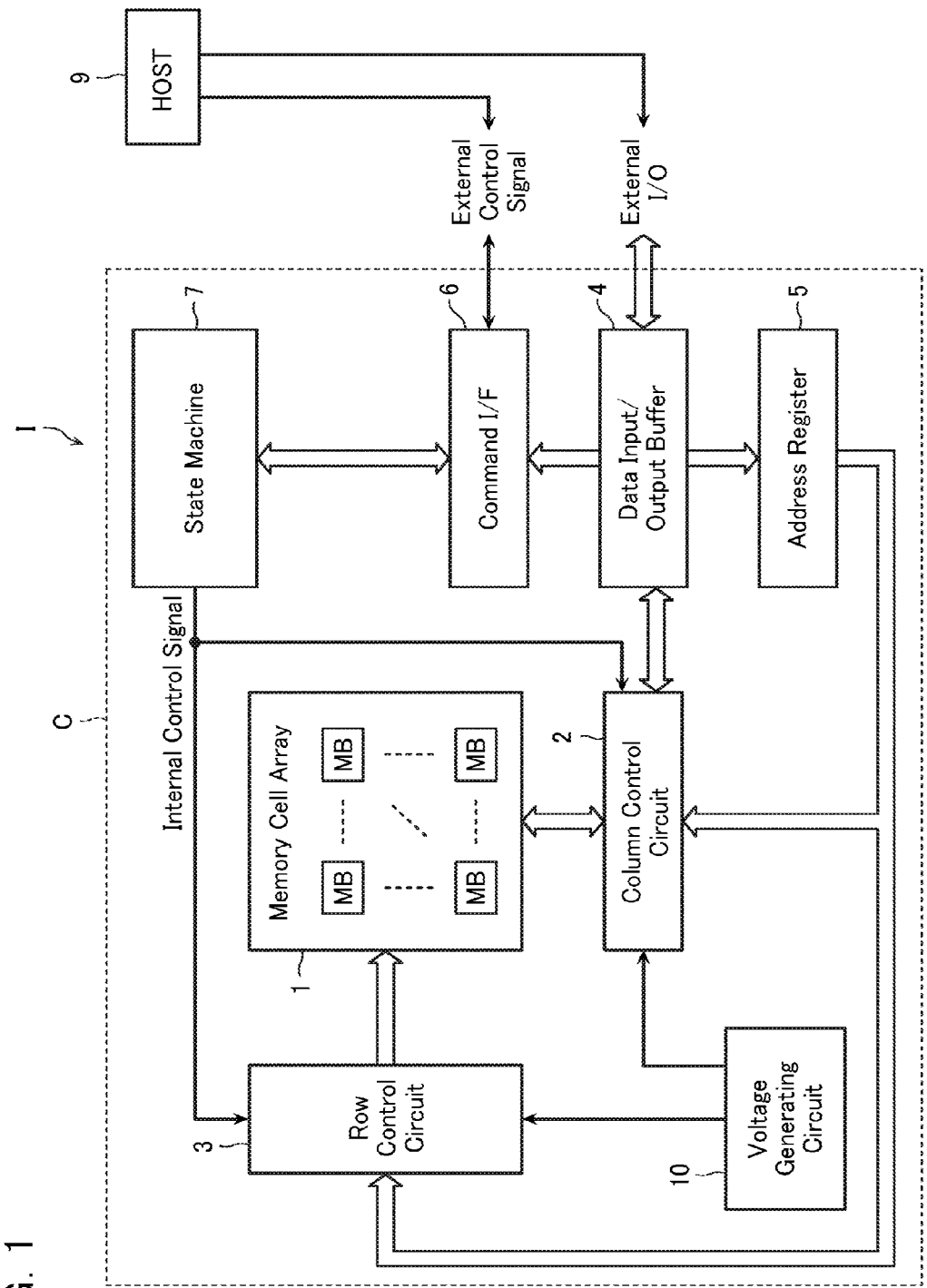
FIG. 1 is a block diagram of a nonvolatile semiconductor memory device according to a first embodiment.

FIG. 1 is a block diagram of a nonvolatile semiconductor memory device according to a first embodiment. Note that the nonvolatile semiconductor memory device referred to herein means, for example, the likes of a chip C storing user data or an electronic device I (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device I comprises the chip C and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
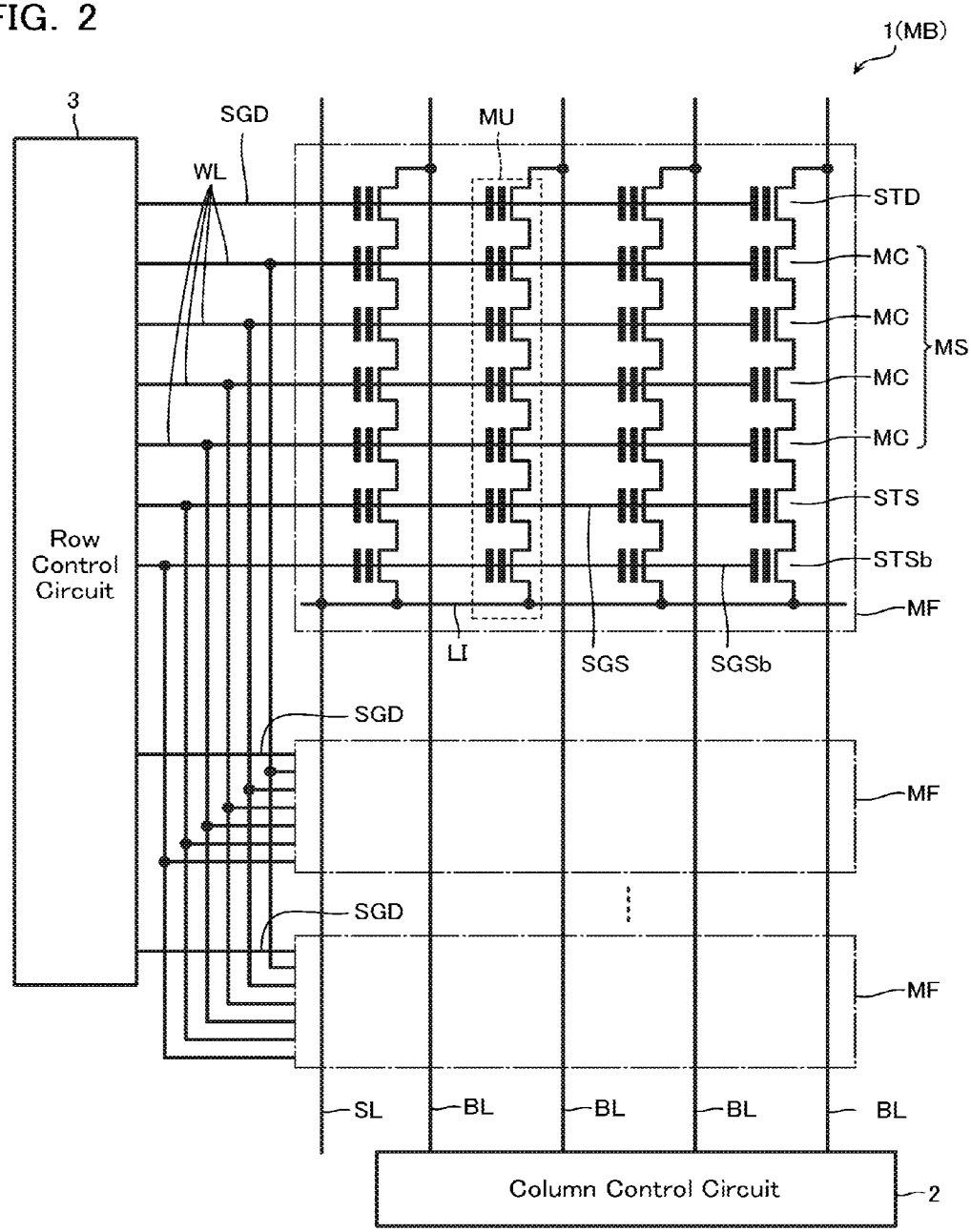
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unillustrated source line driver via a source line SL. Note that for convenience of explanation, in FIG. 2, part of the configuration is omitted.

The memory block MB comprises a plurality of memory fingers MF. The memory finger MF comprises a plurality of memory units MU. One ends of these plurality of memory units MU are respectively connected to a plurality of the bit lines BL. Moreover, the other ends of these plurality of memory units MU are each connected to the source line SL via a common source contact LI. The memory unit MU comprises a drain side select gate transistor STD, a memory string MS, a source side select gate transistor STS, and a lowermost layer source side select gate transistor STSb that are connected in series between the bit line BL and the source contact LI.

The memory string MS comprises a plurality of memory cells MC connected in series. The memory cell MC is a field effect transistor that comprises: a semiconductor layer functioning as a channel body; a gate insulating layer; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS are respectively connected to the word lines WL. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Moreover, respectively connected to the control gate electrodes of the drain side select gate transistor STD, the source side select gate transistor STS, and the lowermost layer source side select gate transistor STSb are a drain side select gate line SGD, a source side select gate line SGS, and a lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
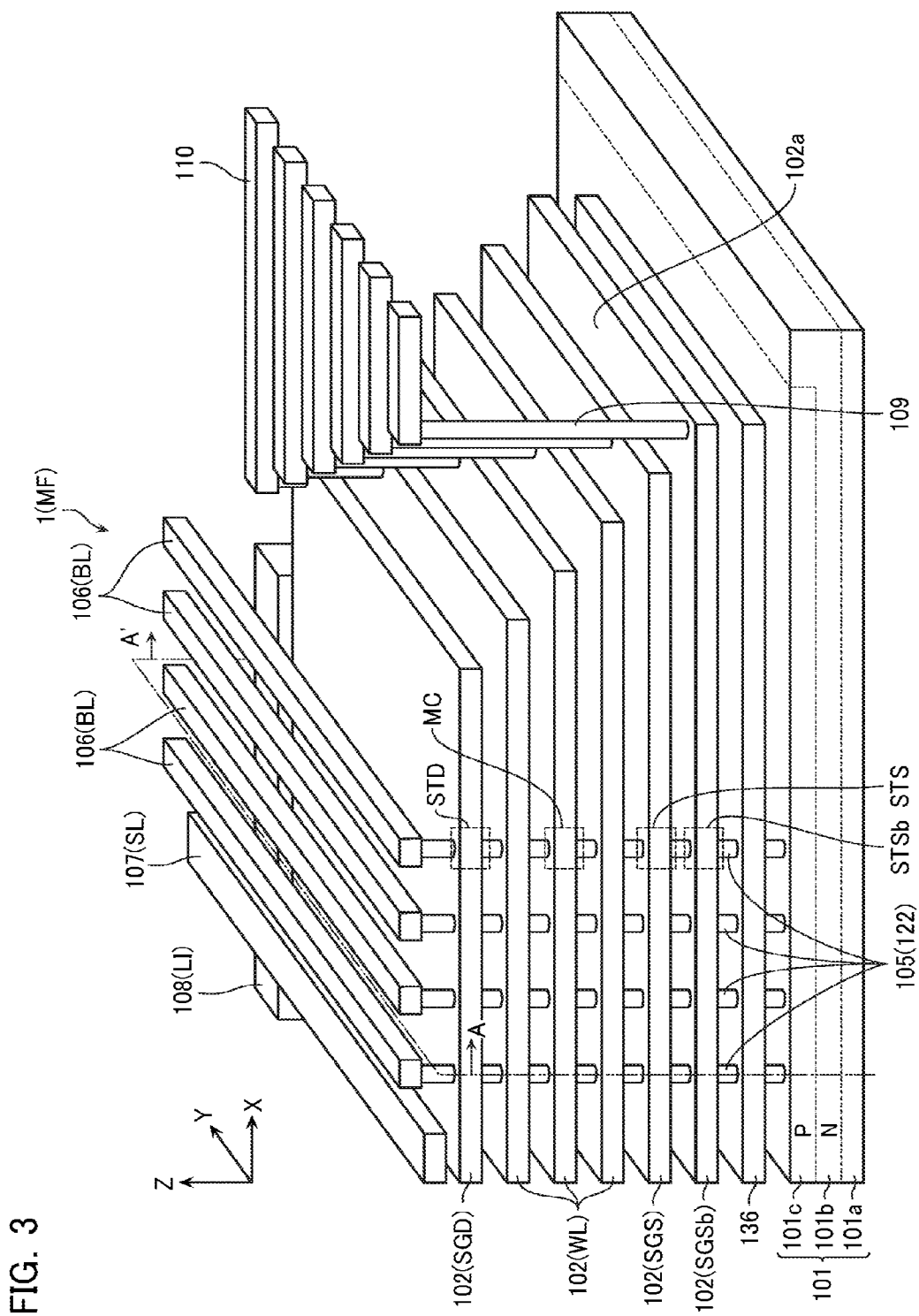
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of a wiring line or the memory cell MC, and so on, and an inter-layer insulating layer provided between the wiring lines, and so on, is not illustrated. In addition, FIG. 3 is illustrated for explanation, and a specific configuration may be appropriately changed. Moreover, in the description below, a certain direction parallel to a surface of a substrate 101 is assumed to be an X direction, a direction parallel to the surface of the substrate 101 and perpendicular to the X direction is assumed to be a Y direction, and a direction perpendicular to the surface of the substrate 101 is assumed to be a Z direction. The description below exemplifies the case where a direction in which the memory string MS extends (first direction) matches the Z direction, but the first direction need not match the Z direction. Additionally, the description below exemplifies the case where a direction intersecting the first direction (second direction) matches the Y direction, but the second direction need not match the Y direction. Furthermore, in the description below, a surface of an object facing the substrate 101 is assumed to be a lower surface of the object, and a surface opposite to the lower surface of the object is assumed to be an upper surface. Additionally, a direction approaching the substrate is assumed to be downward, and a direction going away from the substrate is assumed to be upward. Additionally, an end of an object nearer the substrate 101 than the other end of the object is assumed to a lower end.

The memory finger MF comprises: the substrate 101; a plurality of first conductive layers 102 stacked upwardly of a substrate 101; a circular column-shaped memory columnar body 105 whose side surface is covered by these first conductive layers 102; a first semiconductor layer (101*c*) connected to a lower end of the memory columnar body 105; a second conductive layer 136 provided between the first semiconductor layer (101*c*) and the plurality of first conductive layers 102; and a contact 108 connected to the second conductive layer 136. The substrate 101, the first conductive layer 102, the memory columnar body 105, the first semiconductor layer (101*c*), the second conductive layer 136, and the contact 108 will be described in order below.

The substrate 101 is a semiconductor substrate configured from the likes of monocrystalline silicon (Si), for example. The substrate 101 comprises a double well structure that includes an N type impurity layer 101*b* on a surface of a semiconductor substrate 101*a* and that further includes a P type impurity layer 101*c* in this N type impurity layer 101*b*. The P type impurity layer 101*c* includes a P type impurity such as boron (B).

The plurality of first conductive layers 102 respectively function as the word line WL and control gate electrode of the memory cell MC, or as the select gate lines (SGSb, SGS, and SGD) and control gate electrodes of the select gate transistors (STSb, STS, and STD). The first conductive layer 102 is configured from a conductive layer of the likes of tungsten (W), for example. In addition, the first conductive layers 102 each comprise a contact part 102a connected to a contact 109 and are connected to the row control circuit 3 (FIGS. 1 and 2) via the contact 109 and a wiring line 110. Note that the contact 109 and the wiring line 110 are configured from a conductive layer of the likes of tungsten (W).

The memory columnar body 105 configures the memory string MS, and so on. That is, an intersection of the first conductive layer 102 and the memory columnar body 105 functions as the memory cell MC or the select gate transistors (STSb, STS, and STD). The memory columnar body 105 includes a substantially circular column-shaped second semiconductor layer 122 extending in the Z direction. The second semiconductor layer 122 faces the plurality of first conductive layers 102 and functions as a channel body of the memory cell MC and the select gate transistors (STSb, STS, and STD). A lower end of the second semiconductor layer 122 is connected to the unillustrated source line driver, via the P type impurity layer 101c, the contact 108, and a conductive layer 107 which is provided upwardly of the contact 108 and functions as the source line SL. An upper end of the second semiconductor layer 122 is connected to the column control circuit 2 (FIGS. 1 and 2) via a conductive layer 106 functioning as the bit line BL. Note that the conductive layer 106 and the conductive layer 107 are configured from a conductive layer of the likes of tungsten (W). Moreover, the conductive layer 106 and the conductive layer 107 are arranged in plurality in the X direction parallel to the substrate 101, and extend in the Y direction parallel to the substrate 101 and intersecting the X direction.

The first semiconductor layer (101c) is a semiconductor layer to which a lower end part of the memory columnar body 105 is connected. In this embodiment, the first semiconductor layer is the P type impurity layer 101c in the upper surface of the substrate 101. The first semiconductor layer (101c) extends in the X direction and the Y direction.

The second conductive layer 136 is configured from a conductive layer of the likes of tungsten (W), for example. The second conductive layer 136 is connected to the memory columnar body 105 and extending in the X direction and the Y direction.

The contact 108 is adjacent to the first conductive layers 102 from the Y direction and functions as the source contact LI. The contact 108 comprises a substantially plate-like shape extending in the X direction and the Z direction along a side surface of a stacked body LB. The contact 108 is configured from a conductive layer of the likes of tungsten (W). The contact 108 is connected at its lower surface to the substrate 101. An upper end of the contact 108 is connected to the conductive layer 107 (SL).

Now, as mentioned above, in the present embodiment, the second conductive layer 136 is provided between the substrate 101 and the plurality of first conductive layers 102. The second conductive layer 136 is electrically connected between the second semiconductor layer 122 and the contact 108. Therefore, in the present embodiment, the P type impurity layer 101c (first semiconductor layer) and the second conductive layer 136 are connected in parallel between the second semiconductor layer 122 and the contact 108. The P type impurity layer 101c will mainly be a path of holes. The second conductive layer 136 will mainly be a path of electrons.

Figure 4:
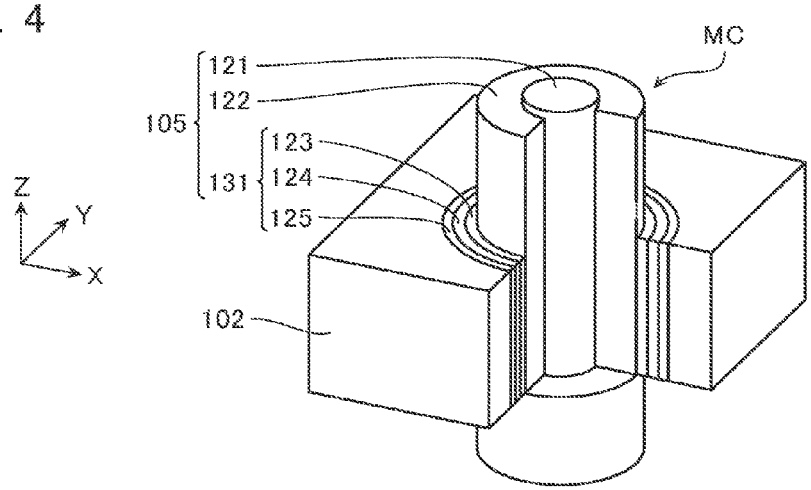
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, and STD) may also be configured similarly to the memory cell MC. Note that in FIG. 4, part of the configuration is omitted.

The memory cell MC is provided at an intersection of the first conductive layer 102 and the memory columnar body 105. The memory columnar body 105 comprises: a circular column-shaped core insulating layer 121 extending in the Z direction; the second semiconductor layer 122 covering a side surface of the core insulating layer 121; and a gate insulating layer 131 covering a side surface of the second semiconductor layer 122. The gate insulating layer 131 comprises: a tunnel insulating layer 123 covering a side surface of the second semiconductor layer 122; a charge accumulation layer 124 covering a side surface of the tunnel insulating layer 123; and a block insulating layer 125 covering a side surface of the charge accumulation layer 124. Note that the second semiconductor layer 122, the tunnel insulating layer 123, the charge accumulation layer 124, and the block insulating layer 125 extend in the Z direction along the side surface of the core insulating layer 121.

The core insulating layer 121 is configured from an insulating layer of the likes of silicon oxide ($SiO_2$), for example. The second semiconductor layer 122 is configured from a semiconductor layer of the likes of polysilicon, for example. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of the likes of silicon oxide ($SiO_2$) or alumina ($Al_2O_3$), for example.

Figure 5:
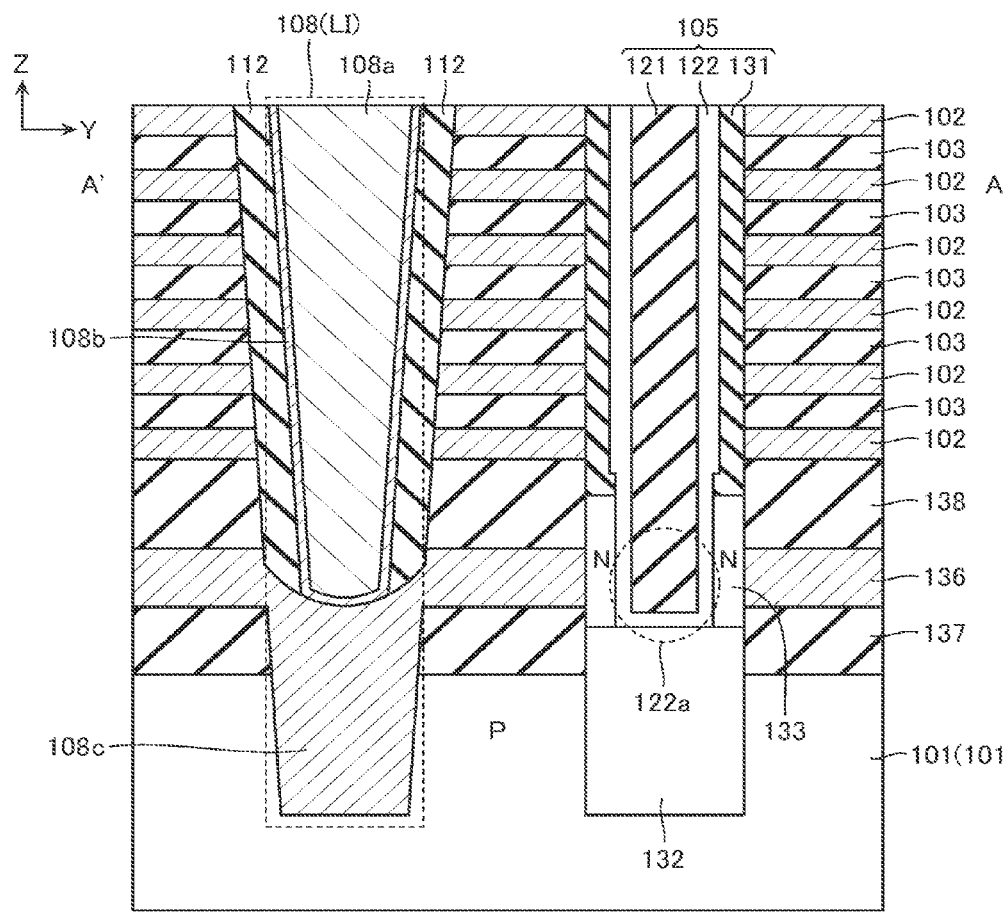
FIG. 5 is a cross-sectional view showing a configuration of part of the same nonvolatile semiconductor memory device.

FIG. 5 is a cross-sectional view of the configuration shown in FIG. 3 cut by a plane including the two dot-chain line in FIG. 3 and viewed along a direction of the arrows A and A'. A and A' in FIG. 5 respectively correspond to positions where the arrows A and A' in FIG. 3 are provided. However, in FIG. 5, illustration of the conductive layer 106 is omitted. Moreover, FIG. 5 illustrates the single memory columnar body 105 most closely adjacent to the source contact LI. Note that FIG. 5 is illustrated for explanation, and a specific configuration may be appropriately changed.

The second conductive layer 136 and first conductive layer 102, the memory columnar body 105, and the contact 108 will be described in order below.

First, the second conductive layer 136 and the first conductive layer 102 will be described. An inter-layer insulating layer 137, the second conductive layer 136, and an inter-layer insulating layer 138 are disposed on the substrate 101. The second conductive layer 136 is configured from a conductive layer of the likes of tungsten (W), for example. The inter-layer insulating layer 137 and the inter-layer insulating layer 138 are configured from an insulating layer of the likes of silicon oxide ($SiO_2$), for example. In addition, a plurality of the first conductive layers 102 and inter-layer insulating layers 103 alternately stacked are disposed upwardly of the inter-layer insulating layer 138. The first conductive layer 102 includes a conductive material of the likes of tungsten (W), for example, as mentioned above. Moreover, the inter-layer insulating layer 103 includes an insulating material of the likes of silicon oxide ($SiO_2$), for example.

Next, the memory columnar body 105 will be described. The memory columnar body 105 according to the present embodiment, in addition to comprising the core insulating layer 121, the second semiconductor layer 122, and the gate insulating layer 131 described with reference to the likes of FIG. 4, comprises also a fourth semiconductor layer 132 and a third semiconductor layer 133. The fourth semiconductor layer 132 and the third semiconductor layer 133 will be described in order below.

The fourth semiconductor layer 132 is configured from a semiconductor layer of the likes of monocrystalline silicon, for example. The fourth semiconductor layer 132 contacts the substrate 101 and a lower end of the second semiconductor layer 122. The fourth semiconductor layer 132 is electrically connected to the second semiconductor layer 122 and the P type impurity layer 101c.

The third semiconductor layer 133 is provided between the gate insulating layer 131 and the fourth semiconductor layer 132, and includes an N type impurity. The third semiconductor layer 133 covers a side surface of a lower part 122a of the second semiconductor layer 122. The second semiconductor layer 122 is electrically connected to the second conductive layer 136 via the third semiconductor layer 133. The third semiconductor layer 133 is a semiconductor layer including an N type impurity such as phosphorus (P) or arsenic (As), and is formed from the likes of monocrystalline silicon (Si). Note that, the third semiconductor layer 133 may also be formed from the likes of polysilicon, or a part of the third semiconductor layer 133 may be monocrystalline silicon (the third semiconductor layer 133 may include monocrystalline silicon). For example, the third semiconductor layer 133 includes at least one of phosphorus (P) and arsenic (As).

Next, the contact 108 will be described. The contact 108 extends in the Z direction and is connected at its lower end to the P type impurity layer 101c (first semiconductor layer). The contact 108 comprises: a first portion 108a extending in the Z direction; and a barrier metal layer 108b covering a side surface and lower surface of this first portion 108a. Moreover, a spacer insulating layer 112 is provided between the first portion 108a and the first conductive layer 102. The spacer insulating layer 112 covers the side surface of the first portion 108a via the barrier metal layer 108b. The first portion 108a of the contact 108 is configured from a conductive layer of the likes of tungsten (W). The barrier metal layer 108b is configured from a conductive layer of the likes of titanium nitride (TiN). The spacer insulating layer 112 is configured from an insulating layer of the likes of silicon oxide (SiO$_2$).

In addition, the contact 108 comprises a second portion 108c which electrically connects the first portion 108a, the second conductive layer 136, and the P type impurity layer 101c. This second portion 108c is provided between the first portion 108a and the substrate 101. Moreover, this second portion 108c is formed integrally with the second conductive layer 136. Moreover, this second portion 108c contacts the substrate 101 at a side surface and lower surface of the second portion 108c. Moreover, this second portion 108c is connected at its upper surface to lower surfaces of the spacer insulating layer 112 and the barrier metal layer 108b. Note that the second portion 108c is formed from a conductive layer of the likes of tungsten (W), for example.

Next, advantages of the present embodiment will be described.

First, when performing a write operation in such a nonvolatile semiconductor memory device, for example, electrons are injected into the gate insulating layer 131 of a selected memory cell MC. Electrons may be supplied to the gate insulating layer 131 from the contact 108, via the P type impurity layer 101c and the second semiconductor layer 122, for example. However, since the P type impurity layer 101c whose electrical resistance is not necessarily low interposes in a path of the electrons, a voltage drop in this P type impurity layer 101c gets large. Moreover, in such a case, in order to reduce an interface resistance at the likes of a contact interface between the P type impurity layer 101c and the source contact LI, it ends up becoming necessary to implant an N type impurity, and a manufacturing step ends up becoming difficult.

Accordingly, in the present embodiment, the second conductive layer 136 is provided between the P type impurity layer 101c and the first conductive layer 102, and the second semiconductor layer 122 and the contact 108 are connected via this second conductive layer 136.

Such a configuration makes it possible for the second conductive layer 136 to be formed from a material of low resistivity such as a metal, for example. Therefore, the voltage drop in the path of the electrons can be more reduced compared to a configuration of the kind where the surface of the substrate is adopted as the path of the electrons, for example.

Moreover, in such a configuration, the P type impurity layer 101c is not adopted as the path of the electrons. Therefore, there is no need to implant an N type impurity in a contact surface of the P type impurity layer 101c and the contact 108, and manufacturing can be performed easily.

In addition, when performing an erase operation in such a nonvolatile semiconductor memory device, for example, holes are injected into the gate insulating layer 131 of the memory cell MC. Holes are supplied to the gate insulating layer 131 from the source contact LI, via the P type impurity layer 101c and the second semiconductor layer 122, for example.

Now, when, for example, the P type impurity layer 101c has been formed by the likes of ion implantation, a concentration of P type impurity in the substrate 101 becomes highest at an upper surface of the substrate 101.

Now, in the present embodiment, a lower end of the spacer insulating layer 112 is positioned more upwardly than a substrate 101 upper surface, and a side surface of the second portion 108c of the contact 108 contacts the substrate 101 at a height position of the substrate 101 upper surface. Therefore, the second portion 108c of the contact 108 can be brought into contact with the upper surface of the substrate 101 in which impurity concentration is high, whereby a voltage drop in a path of the holes can be reduced.

Note that in the present embodiment, the second semiconductor layer 122 is not implanted with an impurity such as phosphorus (P), arsenic (As), or boron (B), and at least a concentration of impurity in the second semiconductor layer 122 is lower than a concentration of impurity in the P type impurity layer 101c (first semiconductor layer) and is lower than a concentration of impurity in the third semiconductor layer 133. Similarly, in the present embodiment, the fourth semiconductor layer 132 is not implanted with an impurity such as phosphorus (P), arsenic (As), or boron (B), and at least a concentration of impurity in the fourth semiconductor layer 132 is lower than a concentration of impurity in the P type impurity layer 101c (first semiconductor layer) and is lower than a concentration of impurity in the third semiconductor layer 133.

[Operations]

Figure 6:
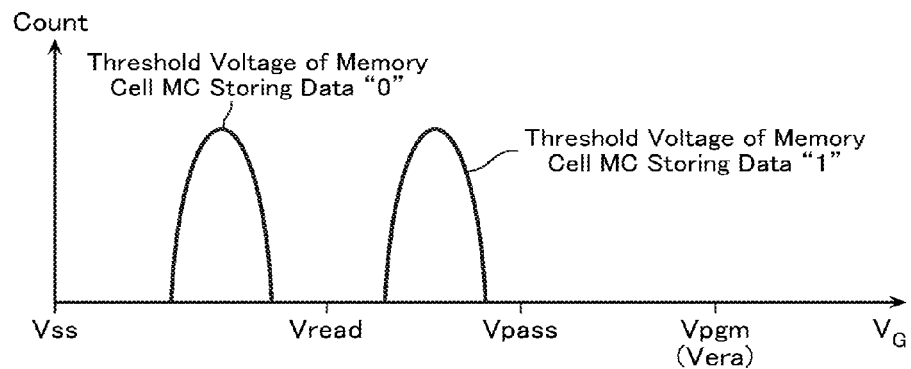
FIG. 6 is a graph for explaining operations of the same nonvolatile semiconductor memory device.
Figure 7:
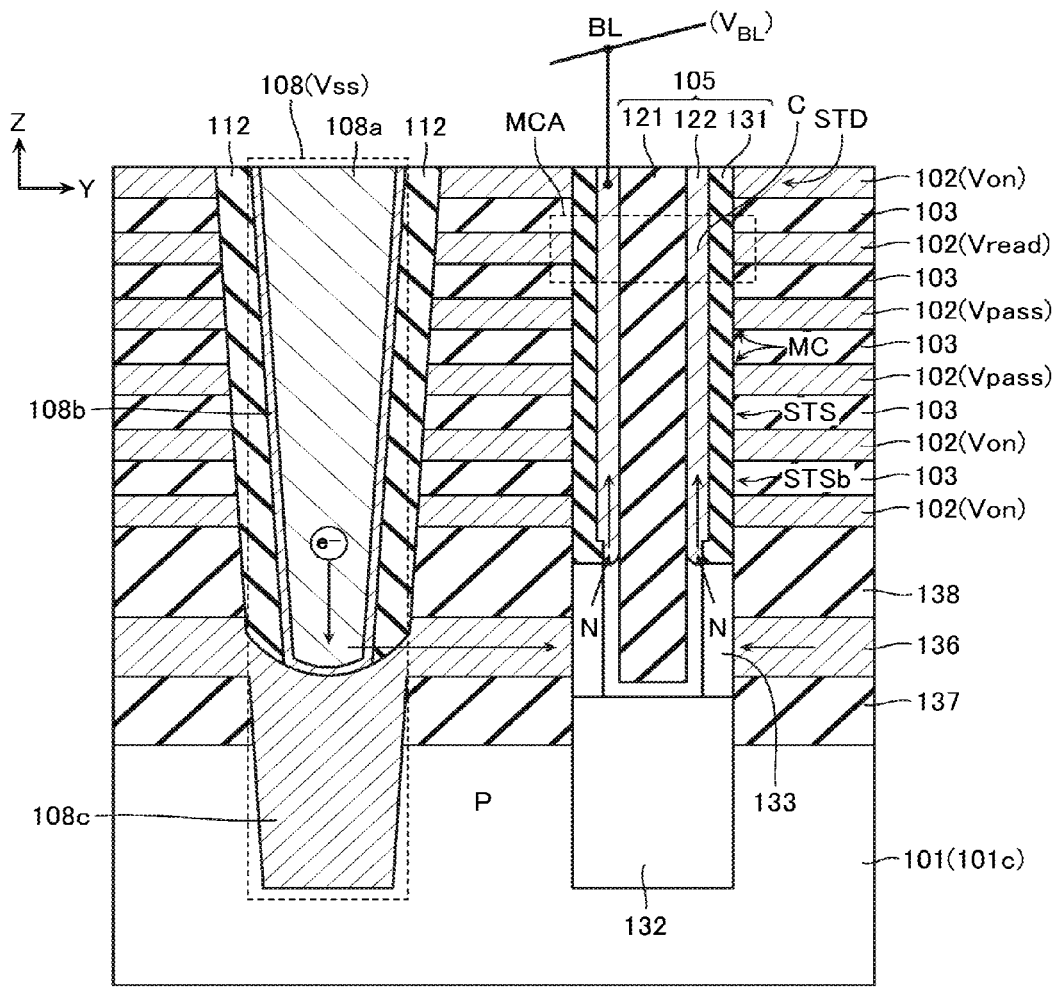
FIG. 7 is a cross-sectional view for explaining a read operation of the same nonvolatile semiconductor memory device.
Figure 8:
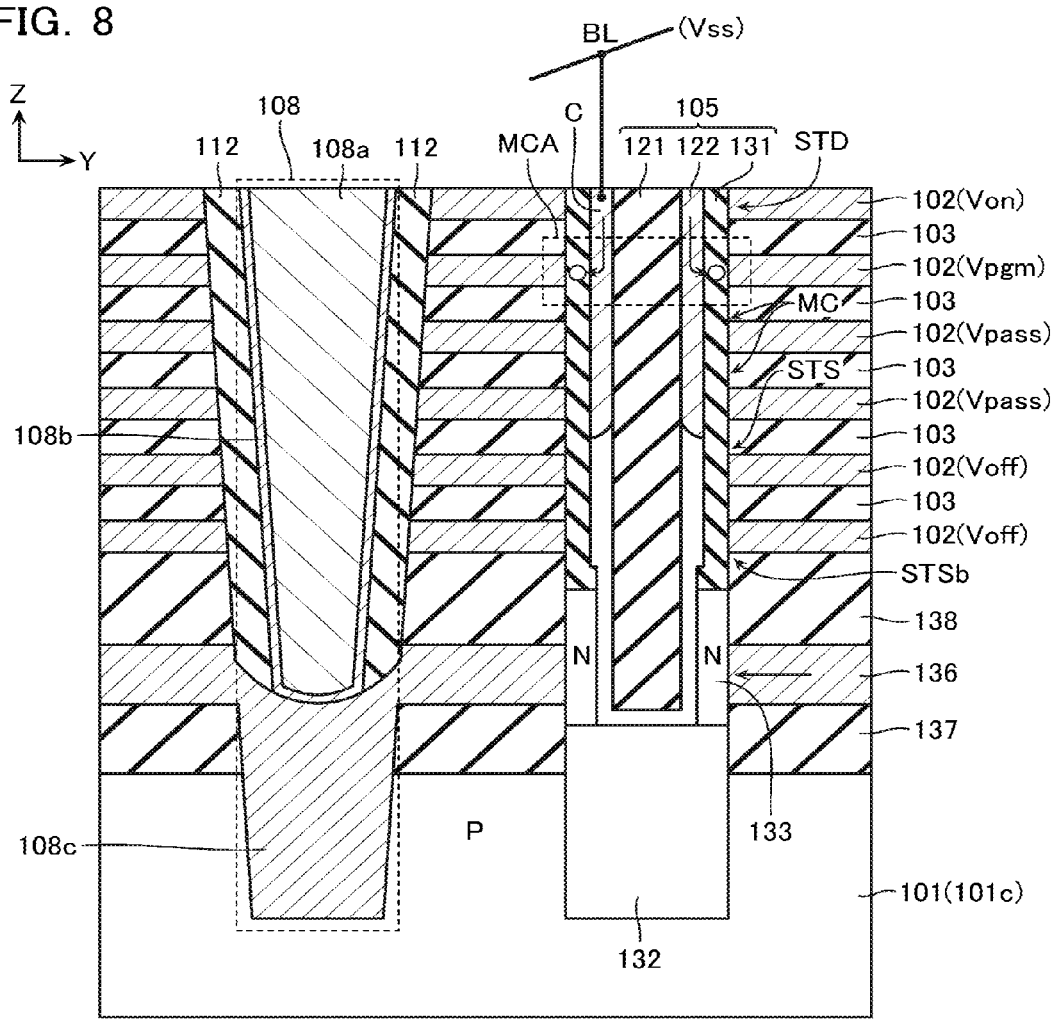
FIG. 8 is a cross-sectional view for explaining a write operation of the same nonvolatile semiconductor memory device.
Figure 9:
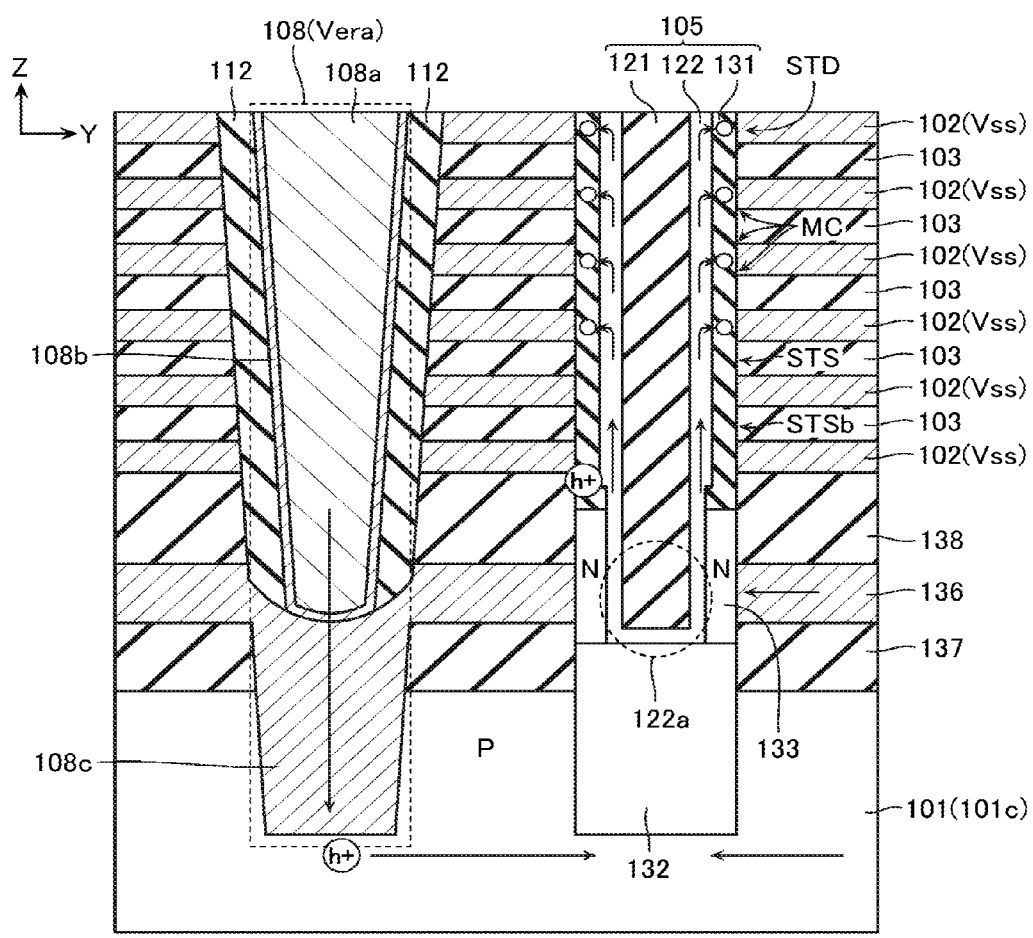
FIG. 9 is a cross-sectional view for explaining an erase operation of the same nonvolatile semiconductor memory device.

FIG. 6 is a histogram for explaining operations of the nonvolatile semiconductor memory device according to the present embodiment, the horizontal axis indicating magnitude of the likes of a voltage $V_G$ applied to the control gate electrode of the memory cell MC, and the vertical axis indicating schematically the number of memory cells MC. FIG. 7 is a cross-sectional view for explaining a read operation of the same nonvolatile semiconductor memory device. FIG. 8 is a cross-sectional view for explaining the write operation of the same nonvolatile semiconductor memory device. FIG. 9 is a cross-sectional view for explaining the erase operation of the same nonvolatile semiconductor memory device.

First, the read operation will be described with reference to FIGS. 6 and 7. In the read operation, a desired memory cell MC is selected as a selected memory cell MCA, and it is determined whether data recorded in this selected memory cell MCA is data "0" or is data "1".

In the read operation, as shown in FIG. 7, the contact 108 is applied with a ground voltage Vss. The ground voltage Vss is 0 V, for example.

Moreover, in the read operation, the control gate electrode (first conductive layer 102) connected to an unselected memory cell MC is applied with a pass voltage Vpass, and the control gate electrodes (first conductive layers 102) of the select gate transistors (STSb, STS, and STD) are applied with a voltage $V_{ON}$. The pass voltage Vpass and the voltage $V_{ON}$ have a magnitude of not less than a threshold voltage of the memory cell MC and the select gate transistors (STSb, STS, and STD). Therefore, when the pass voltage Vpass and the voltage $V_{ON}$ are applied, a channel C is formed in a channel body of the unselected memory cell MC and the select gate transistors (STSb, STS, and STD). In other words, the unselected memory cell MC and the select gate transistors (STSb, STS, and STD) attain an ON state (a conductive state between drain and source).

Moreover, in the read operation, the control gate electrode (first conductive layer 102) connected to the selected memory cell MCA is applied with a read voltage Vread. As shown in FIG. 6, the read voltage Vread is larger than a threshold voltage of the memory cell MC recording data "0" and is smaller than a threshold voltage of the memory cell MC recording data "1". Therefore, when the control gate electrode of the selected memory cell MCA is applied with the read voltage Vread, in the case that data "0" was recorded by the selected memory cell MCA, the selected memory cell MCA attains an ON state, and the bit line BL and contact 108 are electrically connected. On the other hand, in the case that data "1" was recorded by the selected memory cell MCA, the selected memory cell MCA attains an OFF state, and the bit line BL and contact 108 are electrically disconnected.

Moreover, in the read operation, as shown in FIG. 7, the bit line BL is applied with a bit line voltage $V_{BL}$. The bit line voltage $V_{BL}$ is a positive voltage larger than the ground voltage Vss, for example. Now, in the case that data "0" was recorded by the selected memory cell MCA, the bit line BL and contact 108 are electrically connected, hence a current flows between the bit line BL and the contact 108. On the other hand, in the case that data "1" was recorded by the selected memory cell MCA, the bit line BL and contact 108 are electrically disconnected, hence a current does not flow between the bit line BL and the contact 108. In the read operation, it is detected whether a current flows in the bit line BL or not, and data recorded in the selected memory cell MCA is determined according to that result.

Now, in the case that data "0" was recorded by the selected memory cell MCA, a current flows between the bit line BL and the contact 108. Moreover, this current is an electron current having electrons as carriers. Therefore, in the case that data "0" was recorded by the selected memory cell MCA, electrons supplied from the contact 108 are supplied to the second semiconductor layer 122 via the second conductive layer 136 and the third semiconductor layer 133. Now, in the present embodiment, the second conductive layer 136 is formed from a material whose resistivity is low, such as a metal. Therefore, the voltage drop between the contact 108 and the second semiconductor layer 122 can be reduced, whereby the current flowing in the bit line BL can be increased.

Next, the write operation will be described with reference to FIGS. 6 and 8. In the write operation, a desired memory cell MC recording data "0" is selected as the selected memory cell MCA, and data recorded in this selected memory cell MCA is rewritten from data "0" to data "1". In other words, electrons are injected into the gate insulating layer 131 of the selected memory cell MCA, and a threshold voltage of the selected memory cell MCA is increased (refer to FIG. 6).

As shown in FIG. 8, in the write operation, the control gate electrode (first conductive layer 102) of the drain side select gate transistor STD connected to a selected memory string which includes the selected memory cell MCA is applied with the voltage $V_{ON}$. Note that the drain side select gate transistor STD connected to an unselected memory string which does not include the selected memory cell MCA is applied with a voltage $V_{OFF}$. The voltage $V_{OFF}$ has a magnitude of less than a threshold voltage of the select gate transistors (STSb, STS, and STD). Furthermore, the control gate electrodes (first conductive layers 102) of the source side select gate transistor STS and the lowermost layer source side select gate transistor STSb are applied with the voltage $V_{OFF}$.

Moreover, in the write operation, the control gate electrodes (first conductive layers 102) of selected memory cell MCA and unselected memory cell MC are applied with the program voltage Vpgm and the pass voltage Vpass. As shown in FIG. 6, the program voltage Vpgm is larger than the pass voltage Vpass. Moreover, the bit line BL is applied with the ground voltage Vss.

When these voltages are applied, electrons in the second semiconductor layer 122 tunnel to inside the gate insulating layer 131 of the selected memory cell MCA and are accumulated in the gate insulating layer 131. At this time, electrons are supplied into the second semiconductor layer 122 from the bit line BL.

Next, the erase operation will be described with reference to FIGS. 6 and 9. In the erase operation, data recorded in a plurality of the memory cells MC is rewritten from data "1" to data "0". In other words, holes are injected into the gate insulating layer 131 of the selected memory cell MCA, and the threshold voltage of the memory cell MC is reduced (refer to FIG. 6). Note that FIG. 9 describes an example where data of all of the memory cells MC in the memory string MS is erased in a batch, but it is also possible for data of one or multiple memory cells MC to be selectively erased.

In the erase operation, the control gate electrodes (first conductive layers 102) of the memory cell MC and the select gate transistors (STSb, STS, and STD) are applied with the ground voltage Vss.

Moreover, in the erase operation, the contact 108 is applied with an erase voltage Vera. As shown in FIG. 6, an absolute value of the erase voltage Vera is larger than the pass voltage Vpass. When the contact 108 has been applied with the erase voltage Vera, holes in the second semiconductor layer 122 tunnel to inside the gate insulating layer 131 of the memory cell MC and are accumulated in the gate insulating layer 131. Note that at this time, holes are supplied into the second semiconductor layer 122 from the contact 108, via the P type impurity layer 101c and the fourth semiconductor layer 132.

Now, in order to attract holes into the gate insulating layer 131 of the memory cell MC, the gate insulating layer 131 must be applied with a voltage of not less than a certain magnitude. Therefore, in the erase operation, it is desirable that a potential in the second semiconductor layer 122 is high, and in addition, it is desirable that the voltage drop between the second semiconductor layer 122 and the contact 108 is small.

Now, in the present embodiment, the second portion 108c of the contact 108 contacts close to the upper surface of the substrate 101 where impurity concentration is high. Therefore, by reducing the voltage drop between the contact 108 and the second semiconductor layer 122 and raising the voltage of the second semiconductor layer 122 in the erase operation, the gate insulating layer 131 of the memory cell MC can be suitably applied with a voltage.

Note that when the contact 108 is applied with the erase voltage Vera, GIDL (Gate-Induced Drain Leakage) occurs at a contact interface of the second semiconductor layer 122 and the third semiconductor layer 133, and holes are generated. These holes are also injected into the gate insulating layer 131 of the memory cell MC.

[Method of Manufacturing]

Figure 10:
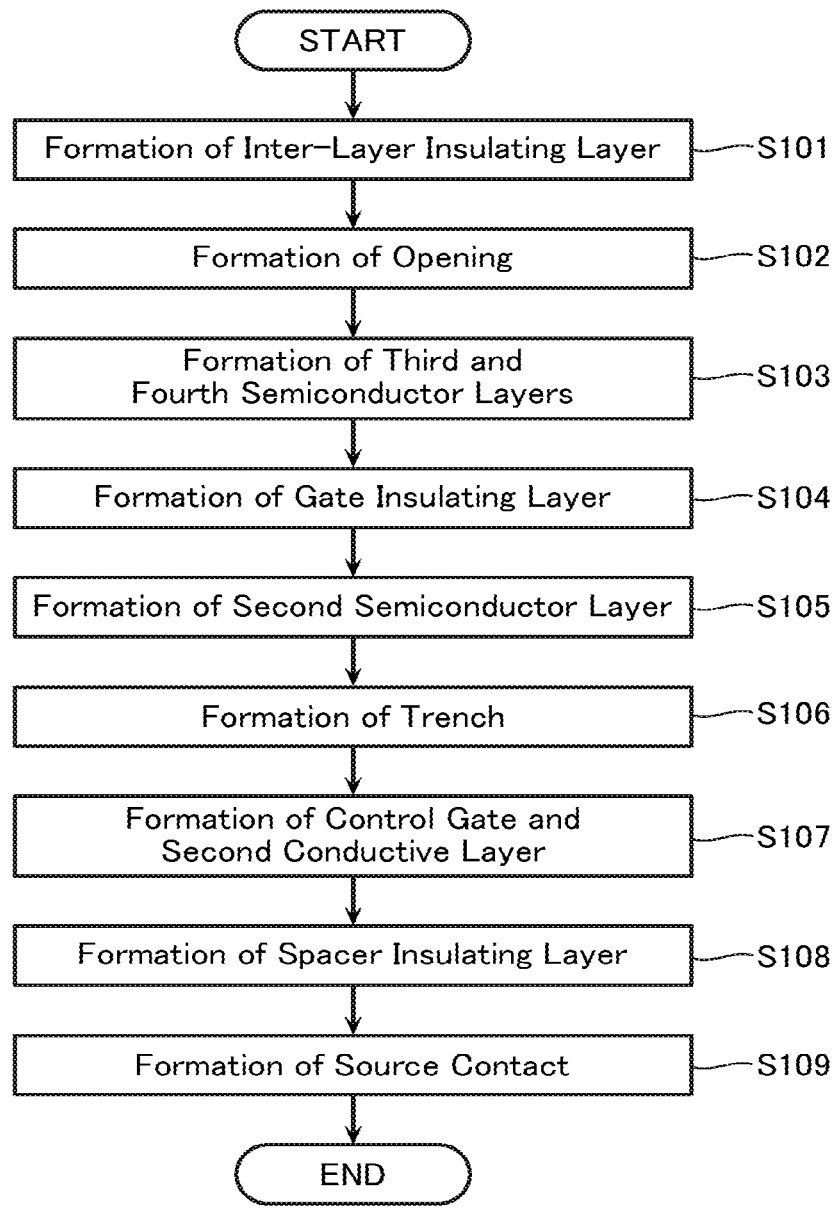
FIG. 10 is a flowchart for explaining a method of manufacturing the same nonvolatile semiconductor memory device.

FIG. 10 is a flowchart for explaining a method of manufacturing according to the first embodiment. FIGS. 11 to 22 are cross-sectional views for explaining the same method of manufacturing.

Figure 11:
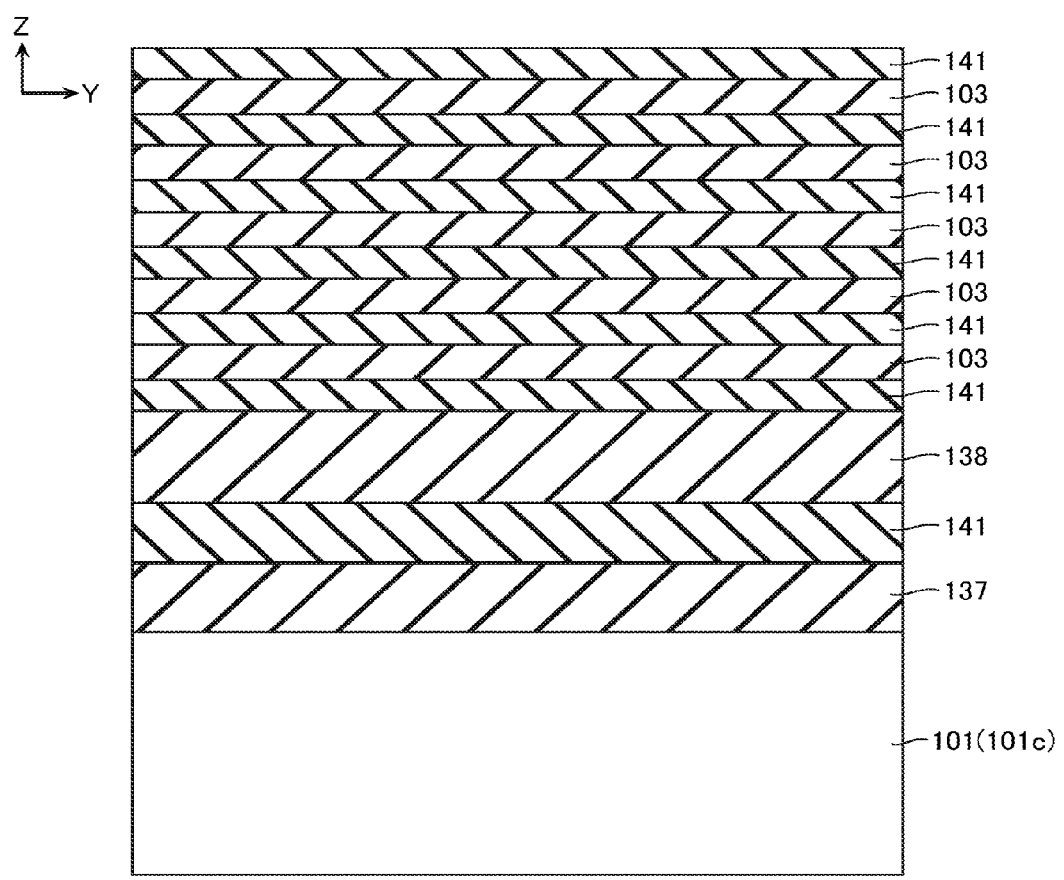
FIGS. 11 to 22 are cross-sectional views for explaining the same method of manufacturing.

As shown in FIGS. 10 and 11, in step S101, a plurality of the inter-layer insulating layers 103, 137, and 138 and sacrifice layers 141 are formed on the substrate 101. The inter-layer insulating layers 103, 137, and 138 are formed by depositing an insulating layer of the likes of silicon oxide ($SiO_2$), by a method such as CVD (Chemical Vapor Deposition), for example. The sacrifice layer 141 is formed by depositing the likes of silicon nitride ($Si_3N_4$), for example, by a method such as CVD.

Figure 12:
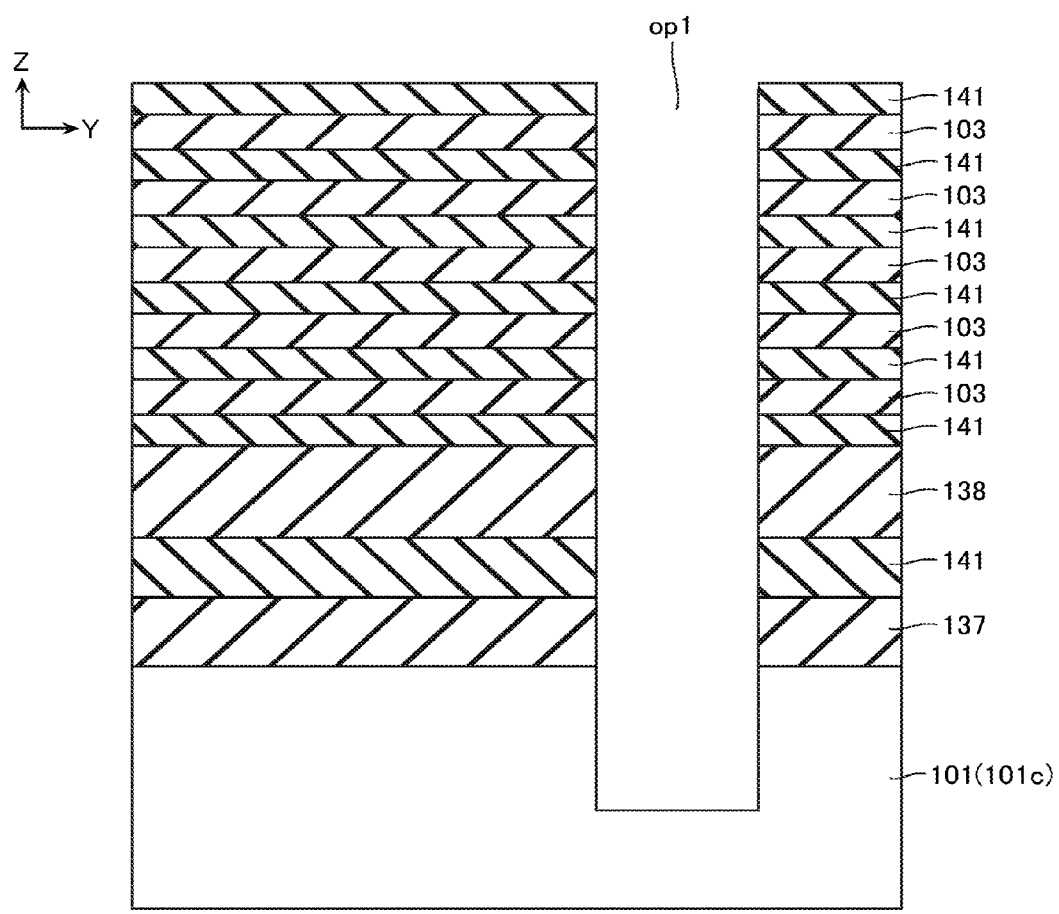

As shown in FIGS. 10 and 12, in step S102, an opening op1 is formed in the inter-layer insulating layers 103, and so on. The opening op1 is a through hole that extends in the Z direction and penetrates the inter-layer insulating layers 103, and so on, to expose an upper surface of the substrate 101. The opening op1 is formed by a means such as RIE (Reactive Ion Etching), for example.

Figure 13:
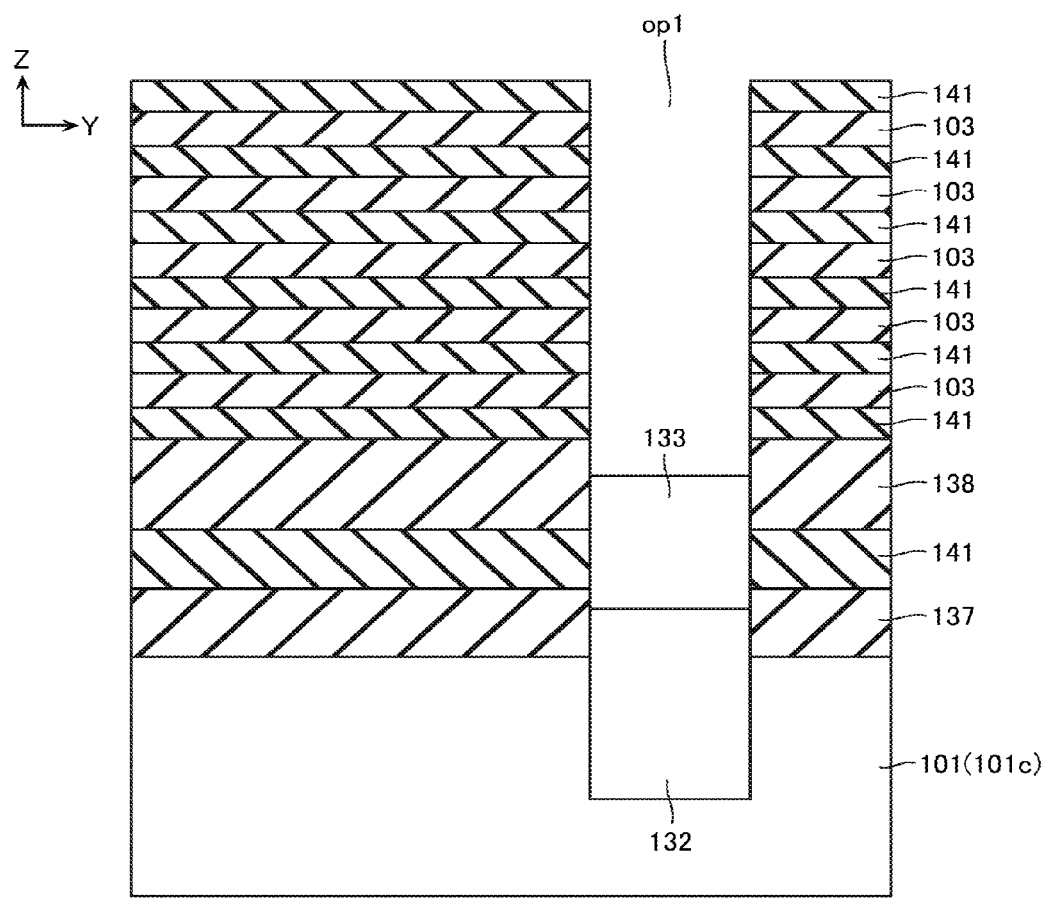

As shown in FIGS. 10 and 13, in step S103, the third semiconductor layer 133 and the fourth semiconductor layer 132 are formed. The fourth semiconductor layer 132 is formed by growing monocrystalline silicon in a bottom part of the opening op1, by a means such as epitaxial growth, for example. The third semiconductor layer 133 is formed by growing monocrystalline silicon including an N type impurity such as phosphorus (P) or arsenic (As), on an upper surface of the fourth semiconductor layer 132, by a means such as epitaxial growth, for example.

Figure 14:
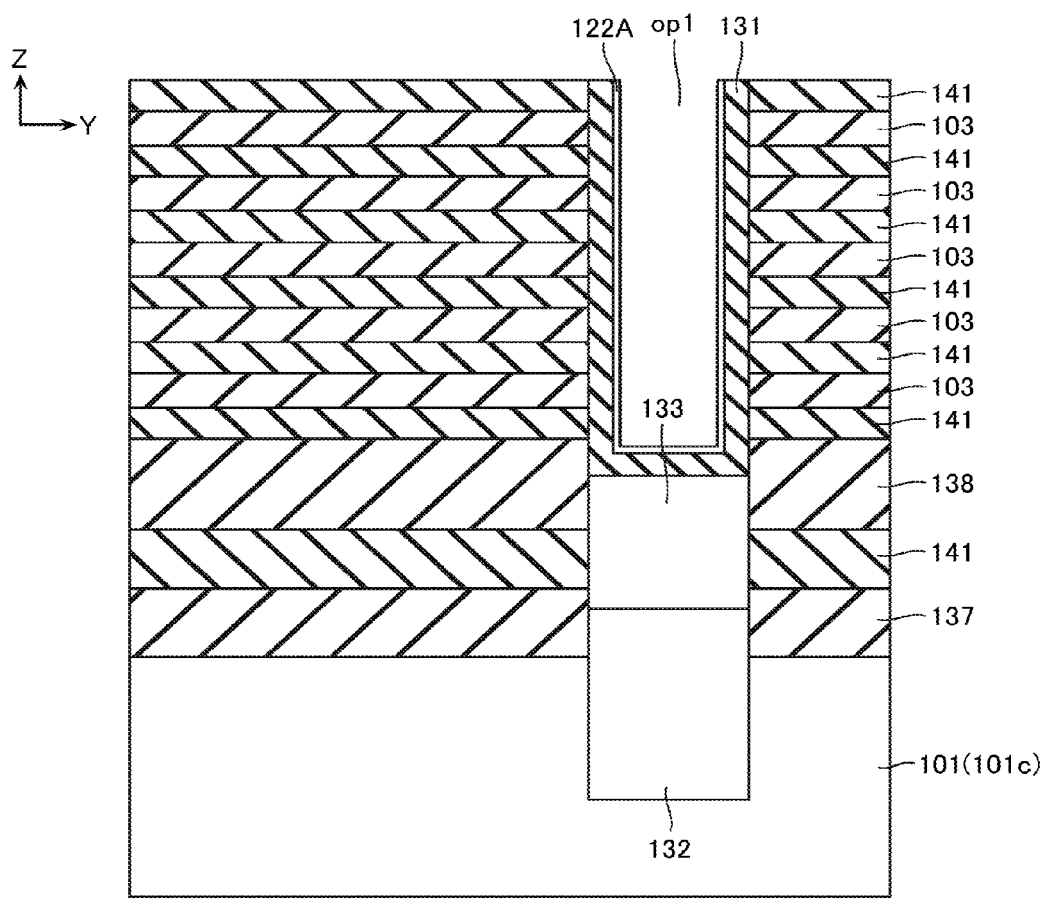
Figure 15:
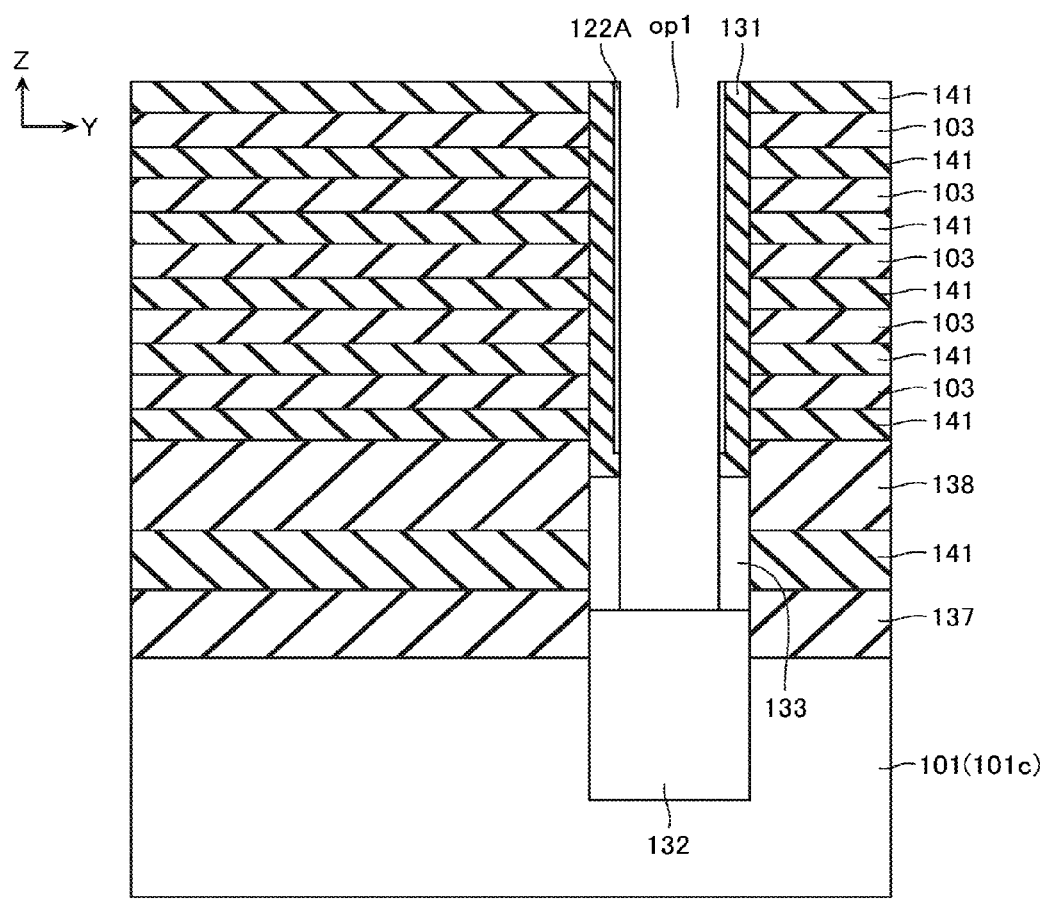

As shown in FIGS. 10, 14, and 15, in step S104, the gate insulating layer 131 is formed.

For example, as shown in FIG. 14, in step S104, film formation of the gate insulating layer 131 is performed. Film formation of the gate insulating layer 131 is performed by sequentially depositing silicon oxide ($SiO_2$), silicon nitride ($Si_3N_4$), and silicon oxide ($SiO_2$) on a side surface of the opening op1 and upper surface of the third semiconductor layer 133. Moreover, in order to protect this gate insulating layer 131, a semiconductor layer 122A which will be part of the second semiconductor layer 122 is deposited. Film formation of the semiconductor layer 122A is performed by depositing the likes of polysilicon on an upper surface and side surface of the gate insulating layer 131, for example. Note that film formation of these layers is performed by a method such as CVD, for example.

Moreover, as shown in FIG. 15, in step S104, processing of the gate insulating layer 131 is performed. In processing of the gate insulating layer 131, for example, portions positioned in the bottom part of the opening op1, of the third semiconductor layer 133, the gate insulating layer 131, and the semiconductor layer 122A are removed, and the upper surface of the fourth semiconductor layer 132 is exposed. Portions formed on the side surface of the opening op1, of the third semiconductor layer 133, the gate insulating layer 131, and the semiconductor layer 122A are left unremoved. Note that this step is performed by a means such as RIE, for example.

Figure 16:
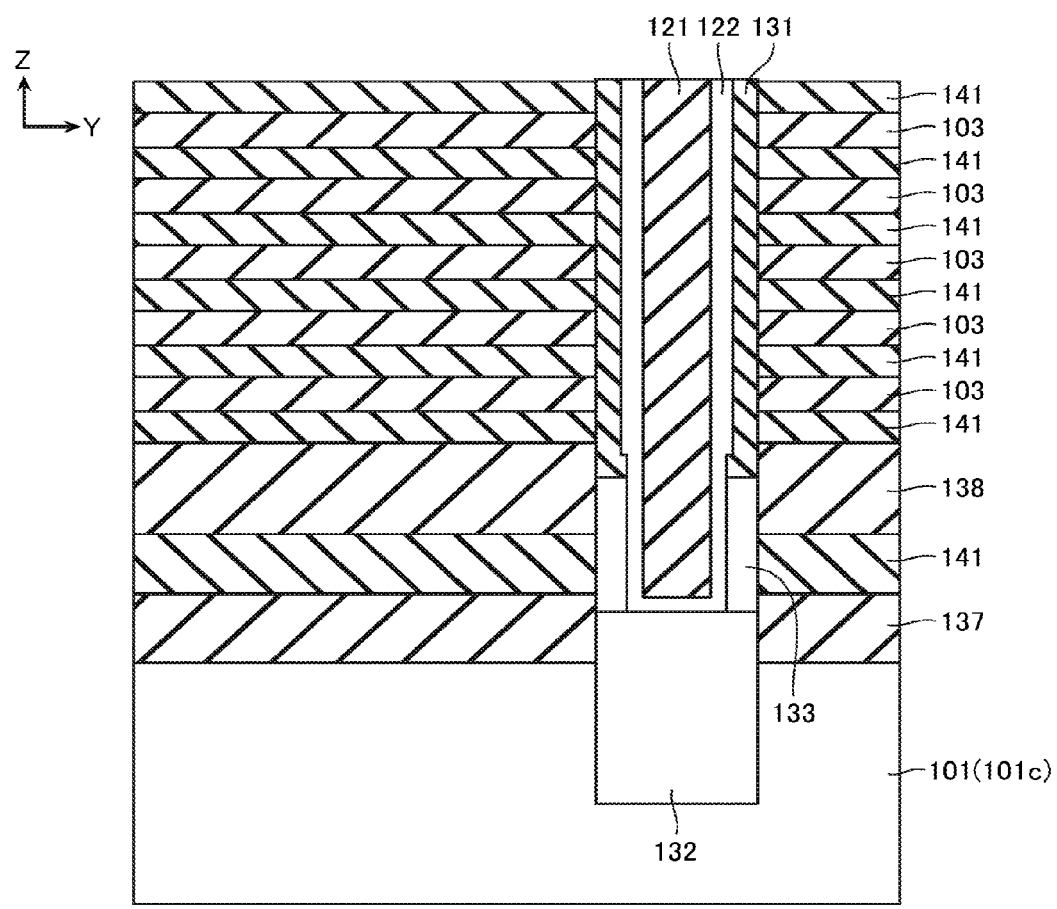

As shown in FIGS. 10 and 16, in step S105, the second semiconductor layer 122 and the core insulating layer 121 are formed. For example, the likes of polysilicon is deposited on side surfaces of the third semiconductor layer 133 and the semiconductor layer 122A and on the upper surface of the fourth semiconductor layer 132, as the second semiconductor layer 122. Film formation of this polysilicon or the like is performed by a method such as CVD, for example. Moreover, the likes of silicon oxide ($SiO_2$) is implanted as the core insulating layer 121.

Figure 17:
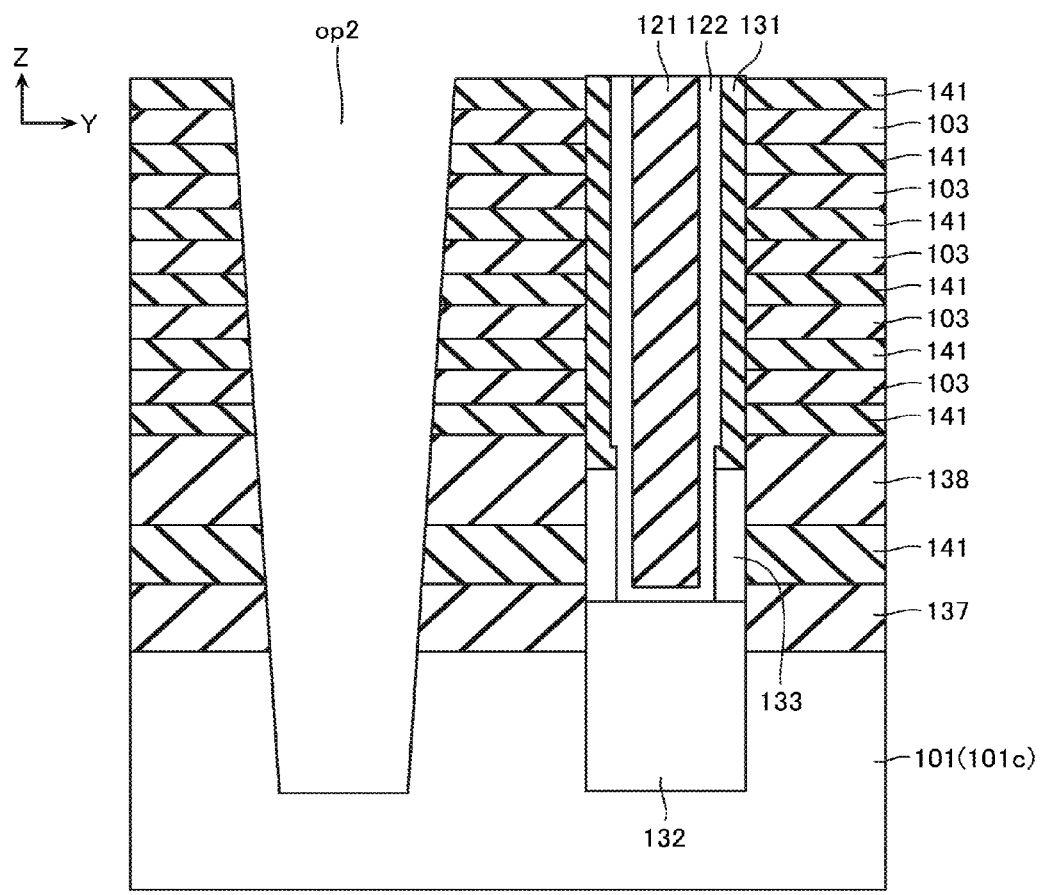

As shown in FIGS. 10 and 17, in step S106, an opening op2 (trench) is formed. The opening op2 is a trench that extends in the Z direction and the X direction, and penetrates the inter-layer insulating layers 103, and so on, to expose the upper surface of the substrate 101. The opening op2 is formed by a means such as RIE, for example.

As shown in FIG. 10 and FIGS. 18 to 20, in step S107, the first conductive layer 102 functioning as a control gate of the memory cell MC, and so on, and the second conductive layer 136, are formed.

Figure 18:
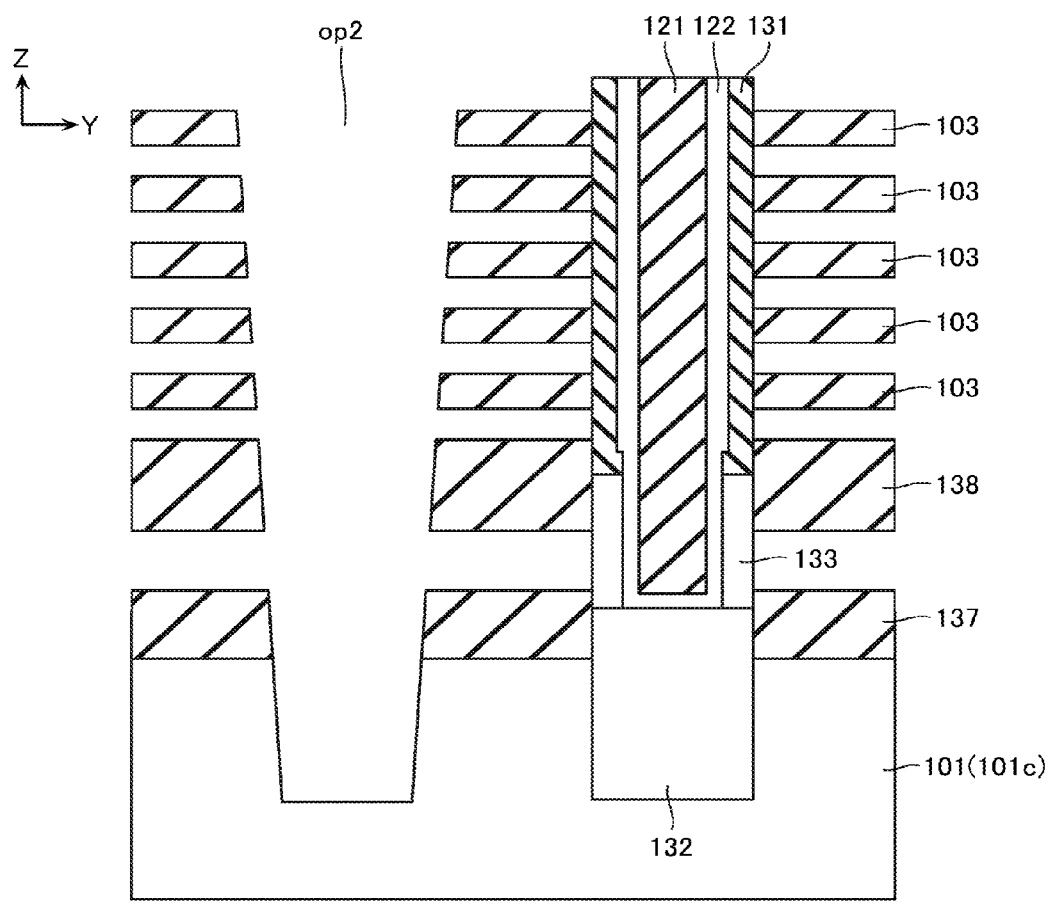

For example, as shown in FIG. 18, in step S107, the sacrifice layer 141 is removed via the opening op2. The sacrifice layer 141 is removed by the likes of wet etching using phosphoric acid, for example.

Figure 19:
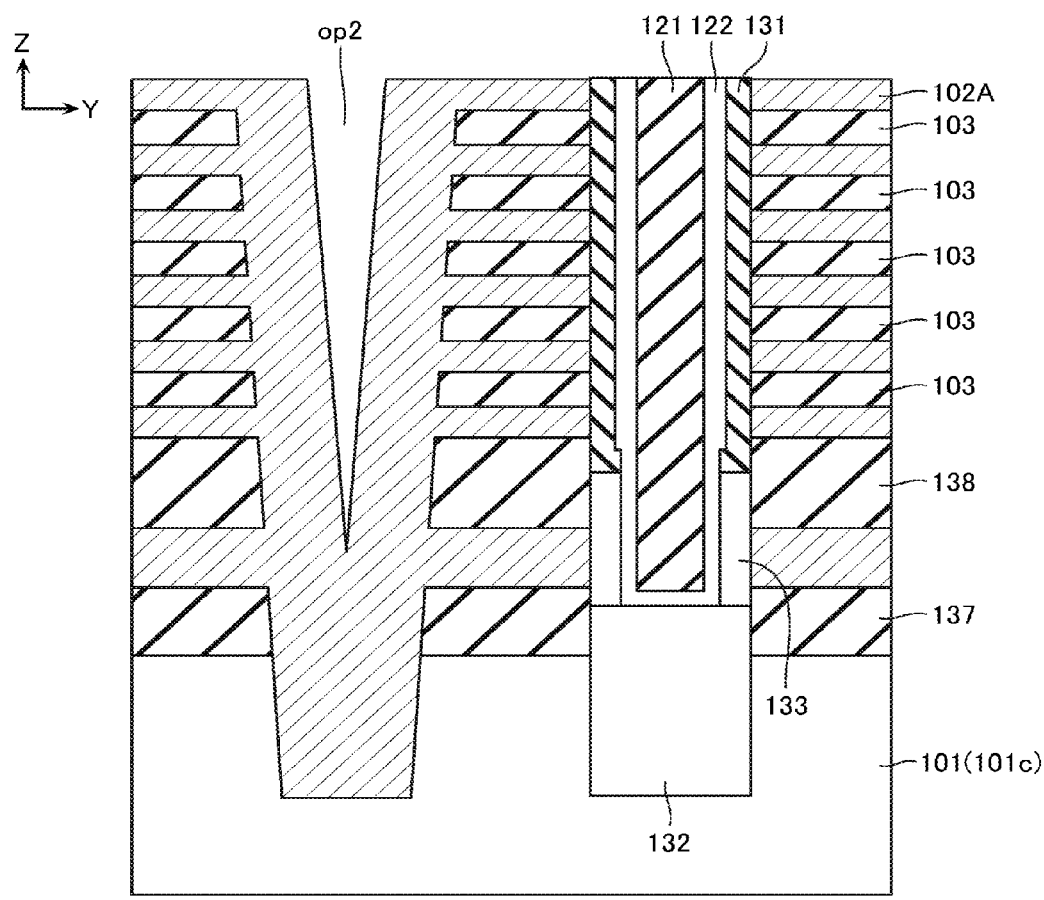

Moreover, as shown in FIG. 19, in step S107, a conductive layer 102A forming the plurality of first conductive layers 102 and the second conductive layer 136, is formed. The conductive layer 102A is formed by depositing the likes of tungsten (W) on upper and lower surfaces of the plurality of inter-layer insulating layers 103, 137, and 138 and on a side surface of the memory columnar body 105, via the opening op2, for example. Film formation of tungsten or the like is performed by a means such as CVD, for example. Moreover, the conductive layer 102A may be a stack of a plurality of different materials, such as a stack of titanium nitride (TiN) and tungsten (W).

Figure 20:
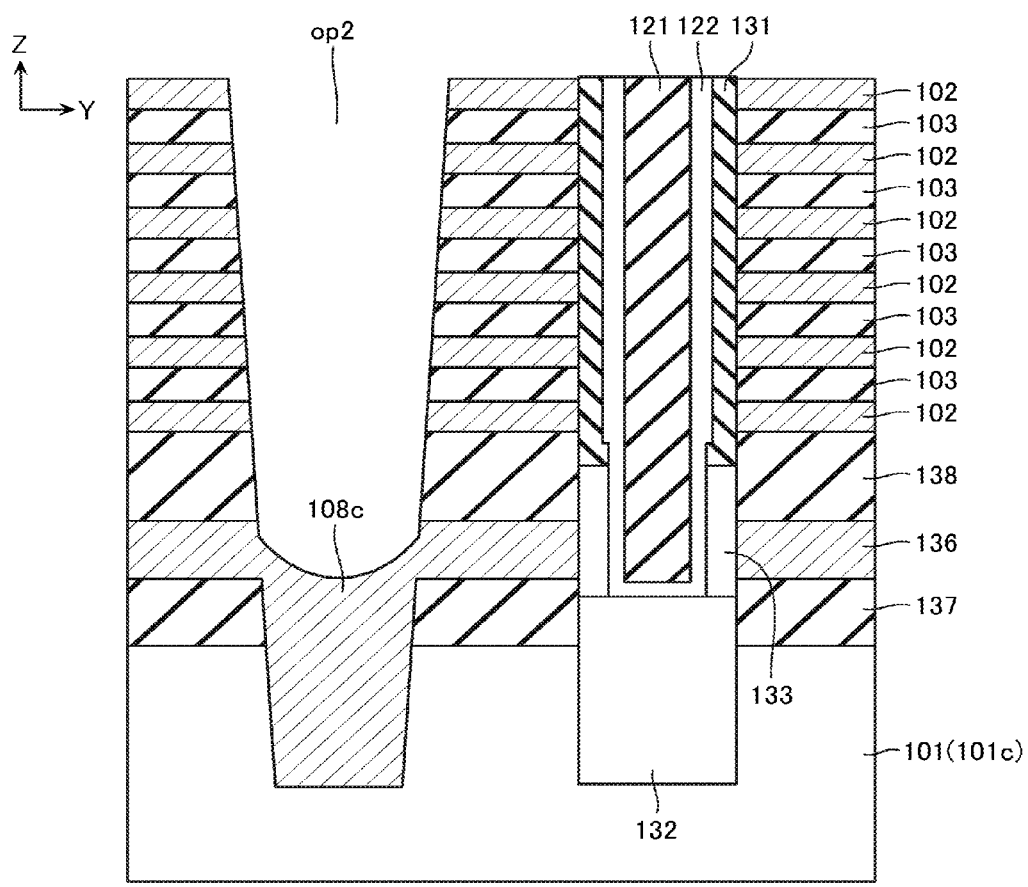

Moreover, as shown in FIG. 20, in step S107, a portion positioned on a side surface of the inter-layer insulating layer 103, of the conductive layer 102A is removed. As a result, the plurality of first conductive layers 102 are formed. Moreover, this step is performed such that a portion forming the second portion 108c of the contact 108 and a portion forming the second conductive layer 136, of the conductive layer 102A, are not divided. As a result, the second portion 108c of the contact 108 and the second conductive layer 136 formed integrally with this second portion 108c, are formed.

Figure 21:
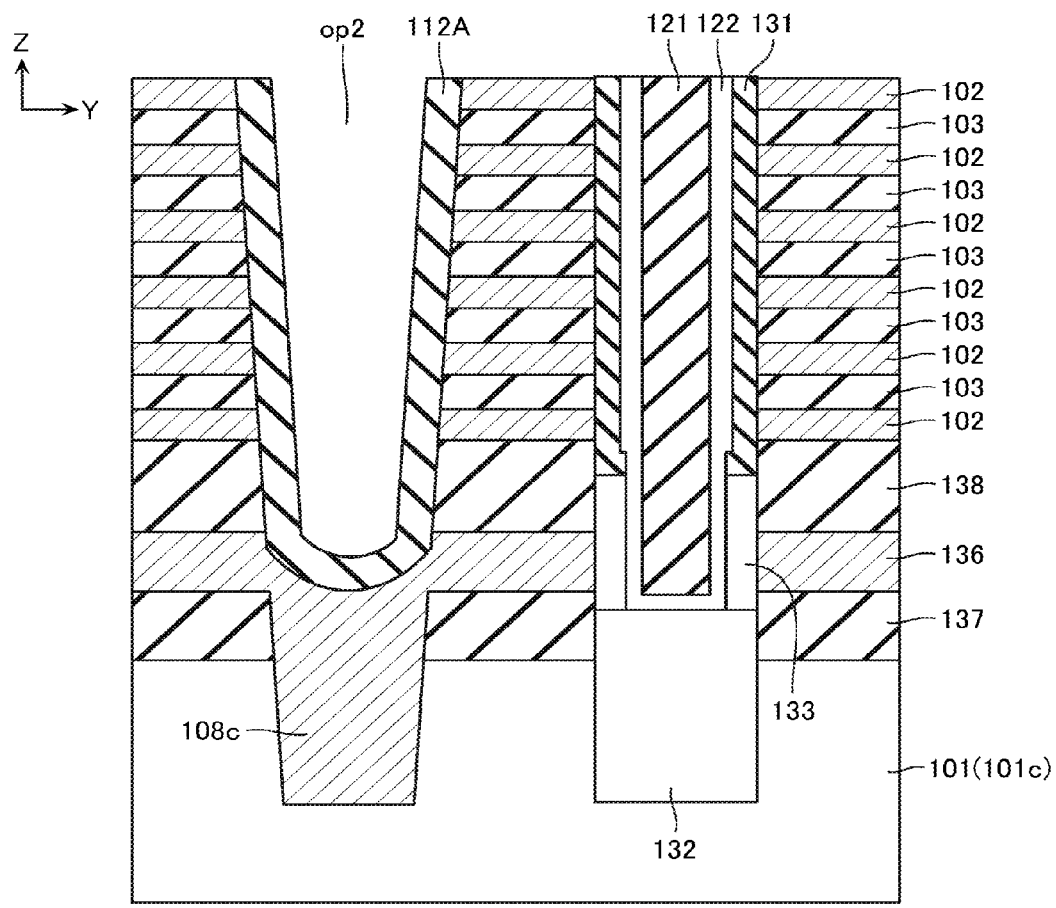
Figure 22:
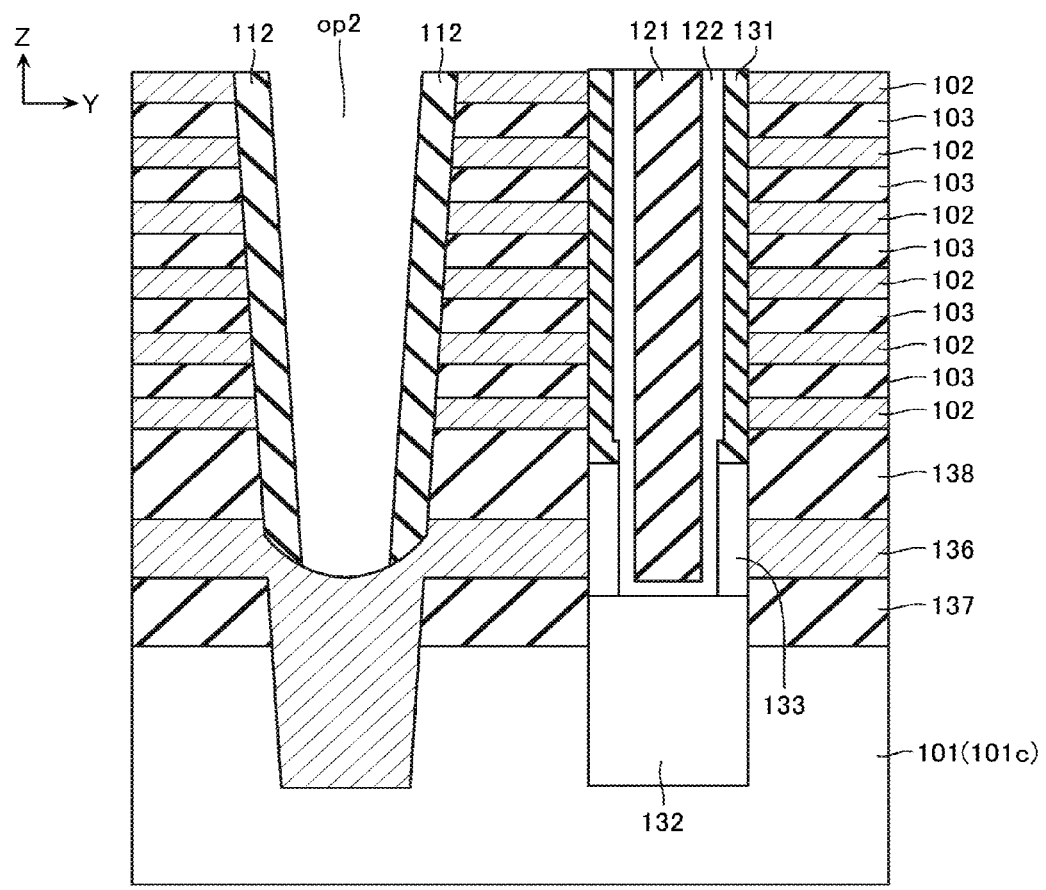

As shown in FIGS. 10, 21, and 22, in step S108, the spacer insulating layer 112 is formed.

For example, as shown in FIG. 21, in step S108, an insulating layer 112A forming the spacer insulating layer 112, is formed. The insulating layer 112A is formed by depositing silicon oxide (SiO$_2$) on a side surface of the opening op2 and an upper surface of the second portion 108c of the contact 108, for example. Film formation of silicon oxide is performed by a method such as CVD, for example.

Moreover, as shown in FIG. 22, in step S108, a portion covering the upper surface of the second portion 108c of the contact 108, of the insulating layer 112A is removed, and the upper surface of the second portion 108c is exposed. A portion formed on the side surface of the opening op2, of the insulating layer 112A is left unremoved and becomes the spacer insulating layer 112. Note that this step is performed by a means such as RIE, for example.

As shown in FIGS. 10 and 5, in step S109, the barrier metal layer 108b and the first portion 108a of the contact 108, are formed. The barrier metal layer 108b and the first portion 108a are formed by sequentially depositing titanium nitride (TiN) and tungsten (W) on a side surface of the spacer insulating layer 112 and the upper surface of the second portion 108c of the contact 108. Film formation of titanium nitride and tungsten is performed by a method such as CVD, for example.

Second Embodiment

[Semiconductor Memory Device]

Figure 23:
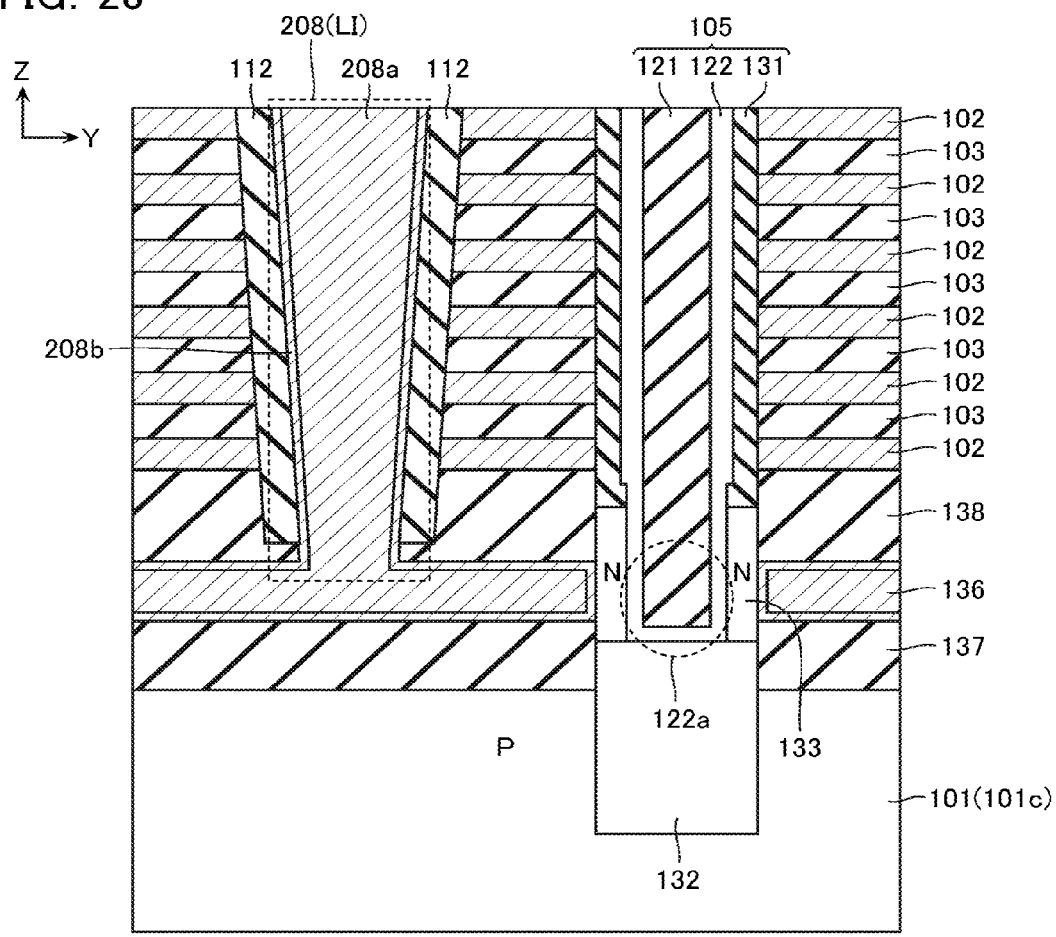
FIG. 23 is a cross-sectional view showing a configuration of part of a nonvolatile semiconductor memory device according to a second embodiment.

FIG. 23 is a cross-sectional view showing a configuration of a nonvolatile semiconductor memory device according to a second embodiment. Note that in the description below, portions similar to those of the first embodiment will be assigned with reference symbols identical to those assigned in the first embodiment, and descriptions thereof will be omitted.

The nonvolatile semiconductor memory device according to the present embodiment is basically configured similarly to the nonvolatile semiconductor memory device according to the first embodiment. However, in the present embodiment, a contact 208 functioning as the source contact LI is not connected to the P type impurity layer 101c (first semiconductor layer). The contact 208 is connected at its lower end to the second conductive layer 136 and is connected, via the second conductive layer 136, to the second semiconductor layer 122. Such a configuration makes it possible for voltages to be applied independently to the contact 208 and the P type impurity layer 101c, and makes it possible for control of a higher degree of freedom to be achieved compared to in the first embodiment. Note that an unillustrated contact or the like may be connected to the P type impurity layer 101c. This makes it possible for voltages to be applied independently to the contact 208 and the P type impurity layer 101c.

Note that the contact 208 according to the present embodiment comprises: a first portion 208a extending in the Z direction; and a barrier metal layer 208b covering a side surface of this first portion 208a. The first portion 208a of the contact 208 is formed integrally with the second conductive layer 136. Moreover, the barrier metal layer 208b covers not only the side surface of the first portion 208a, but also the upper surface, side surface, and lower surface of the second conductive layer 136. Note that the first portion 208a of the contact 208 is formed from a conductive layer of the likes of tungsten (W), for example. The barrier metal layer 208b is formed from a metal layer of the likes of titanium nitride (TiN), for example.

[Method of Manufacturing]

Figure 24:
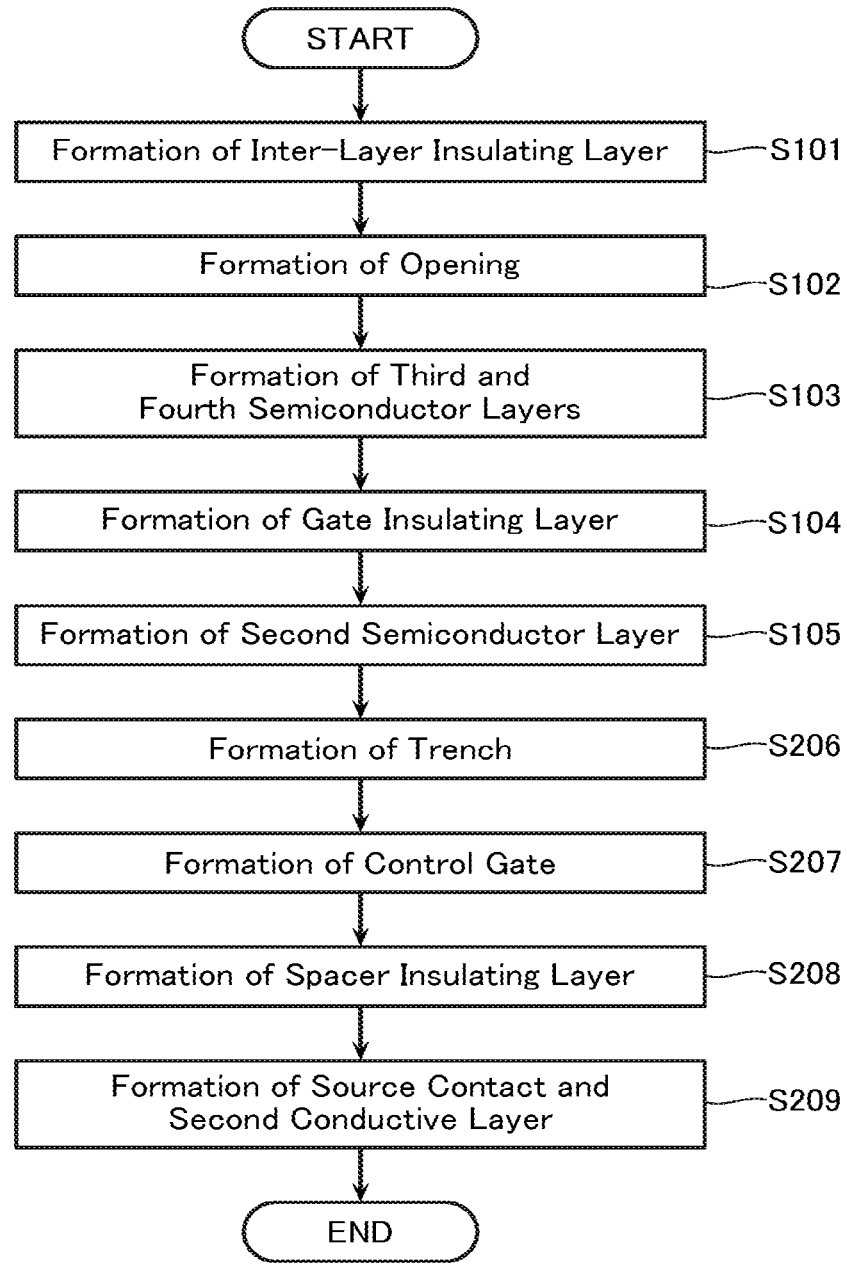
FIG. 24 is a flowchart for explaining a method of manufacturing the nonvolatile semiconductor memory device according to the second embodiment.

FIG. 24 is a flowchart for explaining a method of manufacturing the nonvolatile semiconductor memory device according to the second embodiment. FIGS. 25 to 31 are cross-sectional views for explaining the same method of manufacturing. Note that in the description below, portions similar to those of the first embodiment will be assigned with reference symbols identical to those assigned in the first embodiment, and descriptions thereof will be omitted.

As shown in FIG. 24, the method of manufacturing according to the present embodiment is performed similarly to the method of manufacturing according to the first embodiment from step S101 to step S105.

Figure 25:
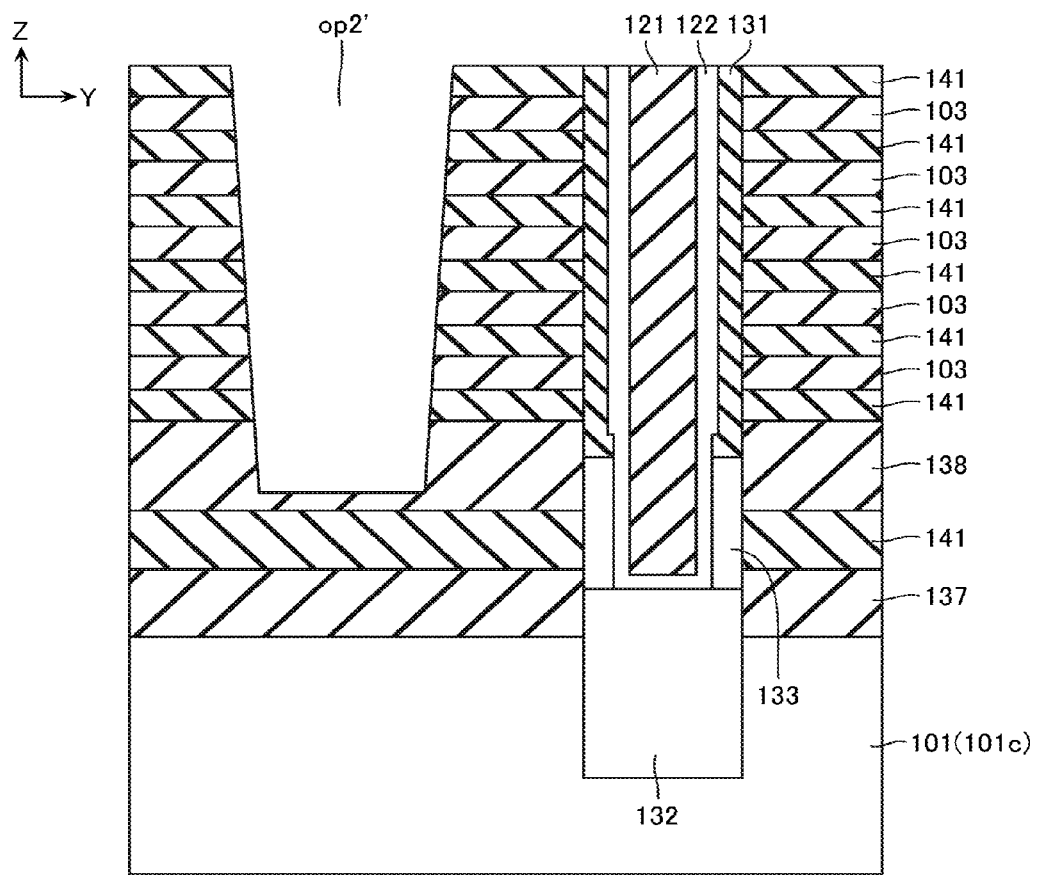
FIGS. 25 to 31 are cross-sectional views for explaining the same method of manufacturing.

As shown in FIGS. 24 and 25, in step S206, an opening op2' (trench) is formed. The opening op2' is a trench that extends in the Z direction and the X direction, and penetrates the inter-layer insulating layers 103, and so on, to expose an upper surface of the inter-layer insulating layer 138. That is, the opening op2' does not penetrate the inter-layer insulating layer 138 which is to contact the upper surface of the second conductive layer 136. Therefore, the sacrifice layer 141 positioned in a lowermost layer, of the plurality of sacrifice layers 141 is not exposed in the opening op2' in step S206. The opening op2' is formed by a means such as RIE, for example.

As shown in FIG. 24 and FIGS. 26 to 28, in step S207, the first conductive layer 102 functioning as a control gate of the memory cell MC, and so on, is formed.

Figure 26:
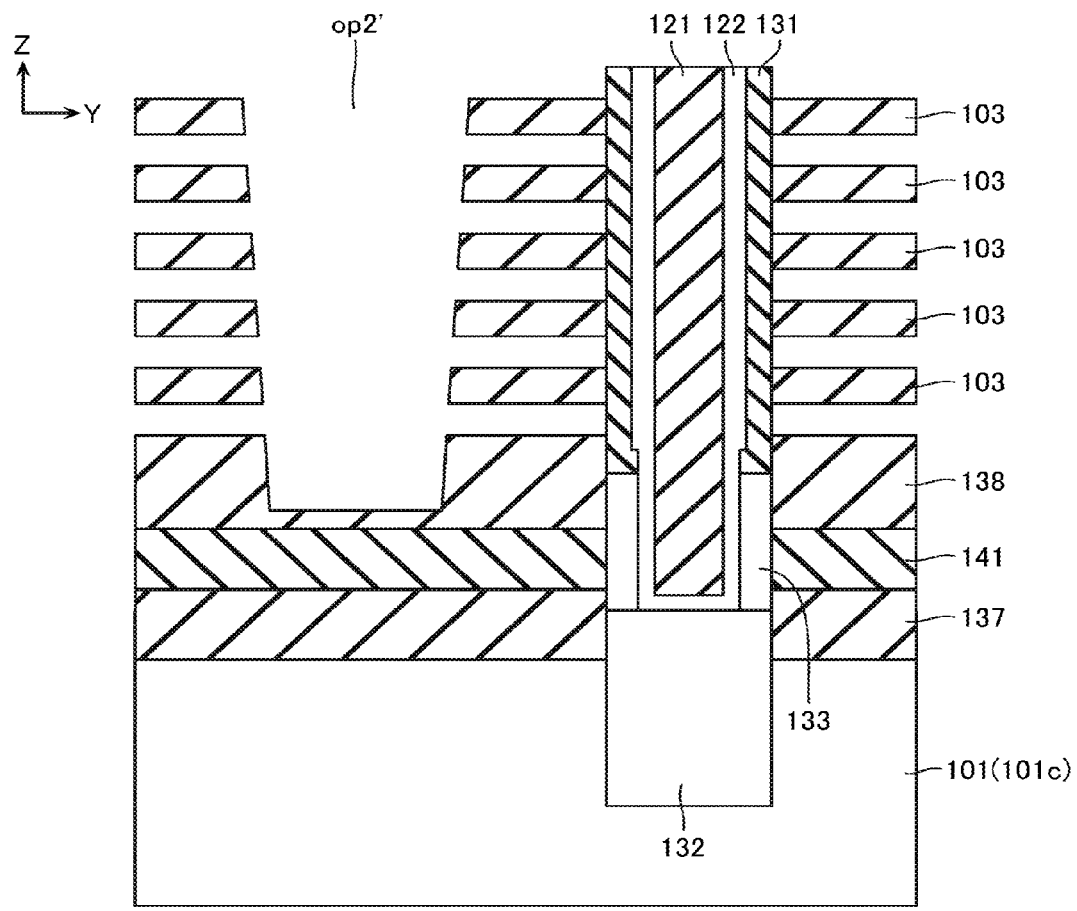

For example, as shown in FIG. 26, in step S207, the sacrifice layers 141 except the lowermost layer sacrifice layer 141 are removed via the opening op2'. The sacrifice layer 141 is removed by the likes of wet etching using phosphoric acid, for example.

Figure 27:
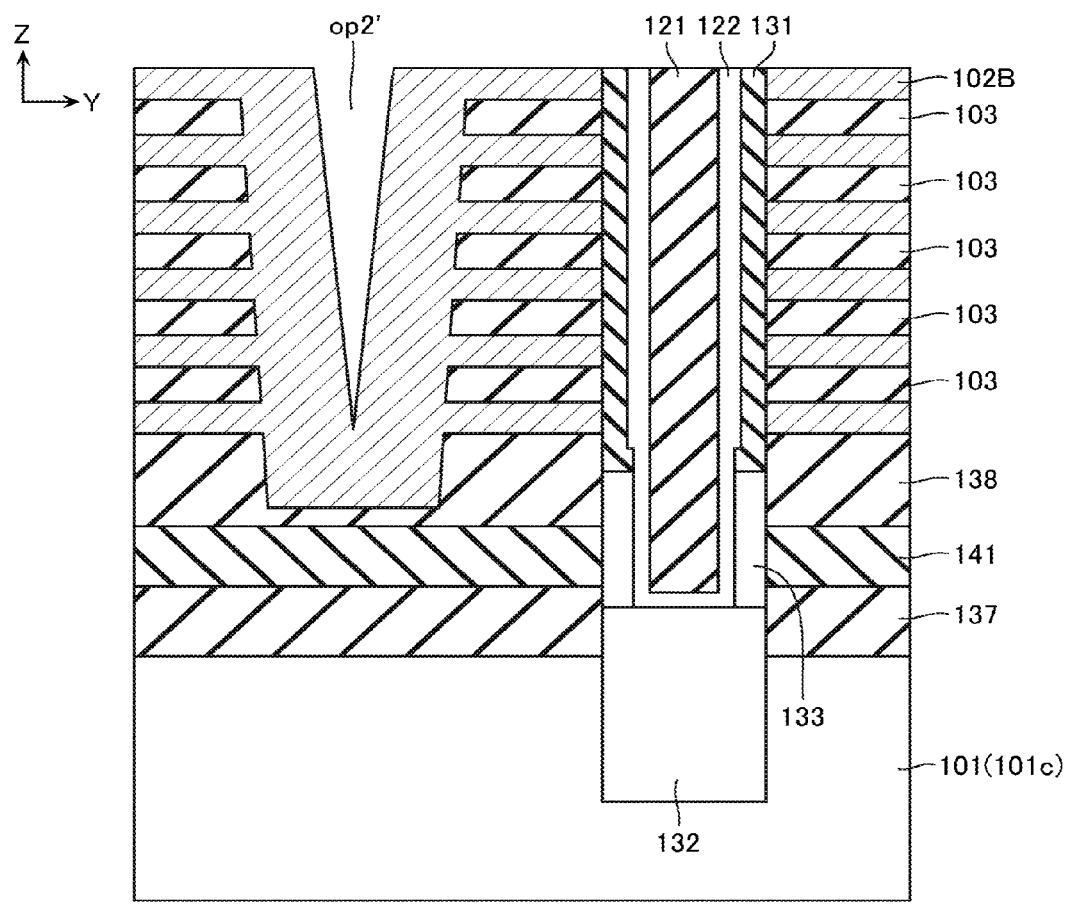

Moreover, as shown in FIG. 27, in step S207, a conductive layer 102B forming the plurality of first conductive layers 102, is formed. The conductive layer 102B is formed by depositing the likes of tungsten (W) on upper and lower surfaces of the plurality of inter-layer insulating layers 103, the upper surface of the inter-layer insulating layer 138, and a side surface of the memory columnar body 105, via the opening op2', for example. Film formation of tungsten or the like is performed by a means such as CVD, for example. Moreover, the conductive layer 102B may be a stack of a plurality of different materials, such as a stack of titanium nitride (TiN) and tungsten (W).

Figure 28:
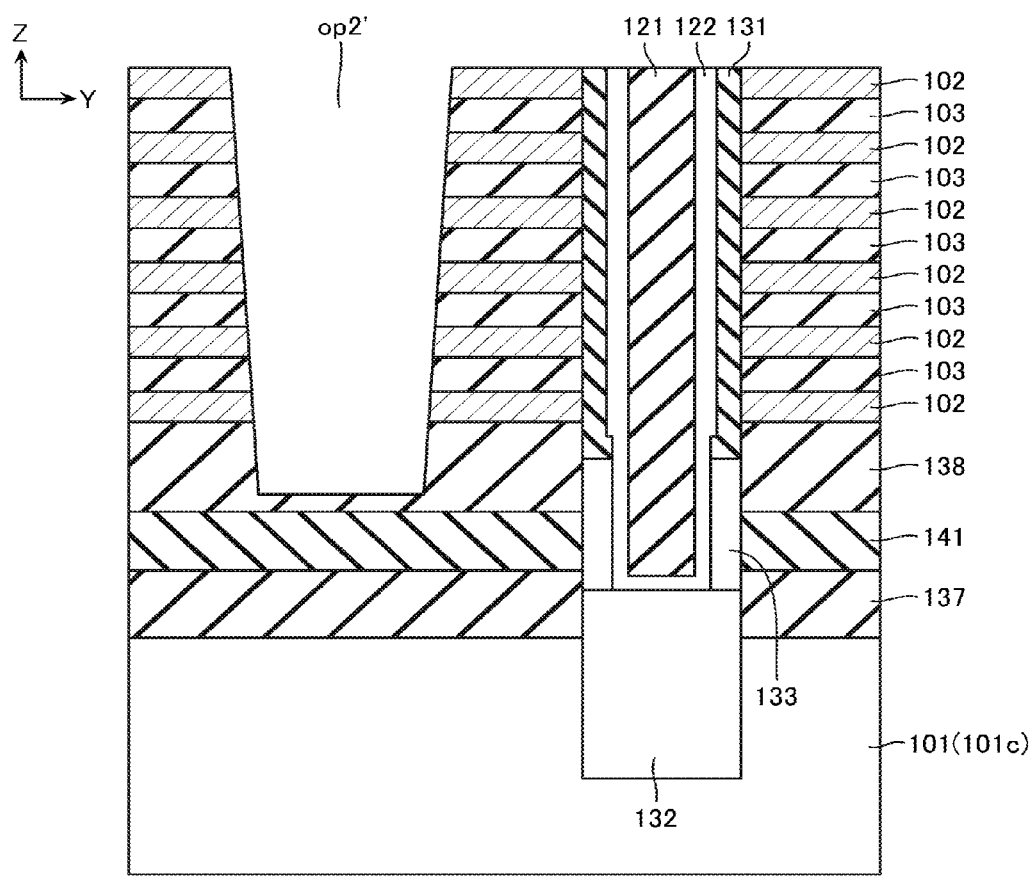

Moreover, as shown in FIG. 28, in step S207, a portion positioned on a side surface of the inter-layer insulating layer 103, of the conductive layer 102B is removed. As a result, the plurality of first conductive layers 102 are formed.

Figure 29:
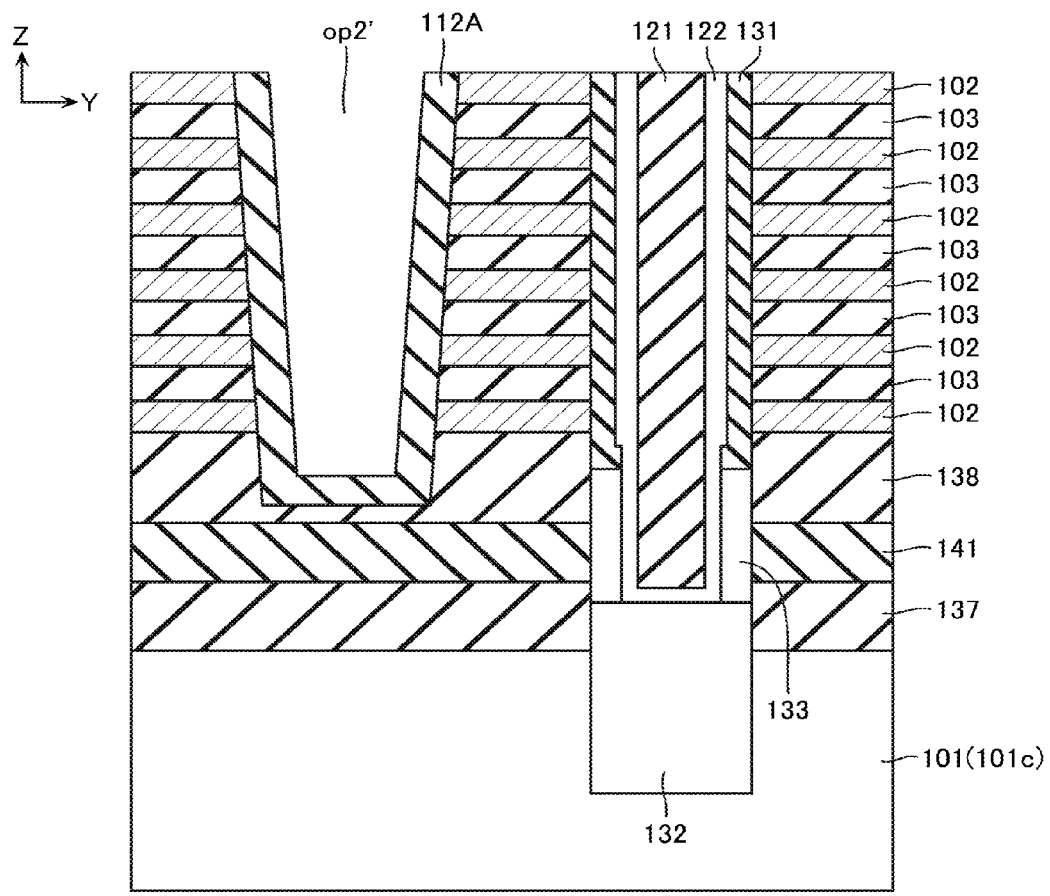
Figure 30:
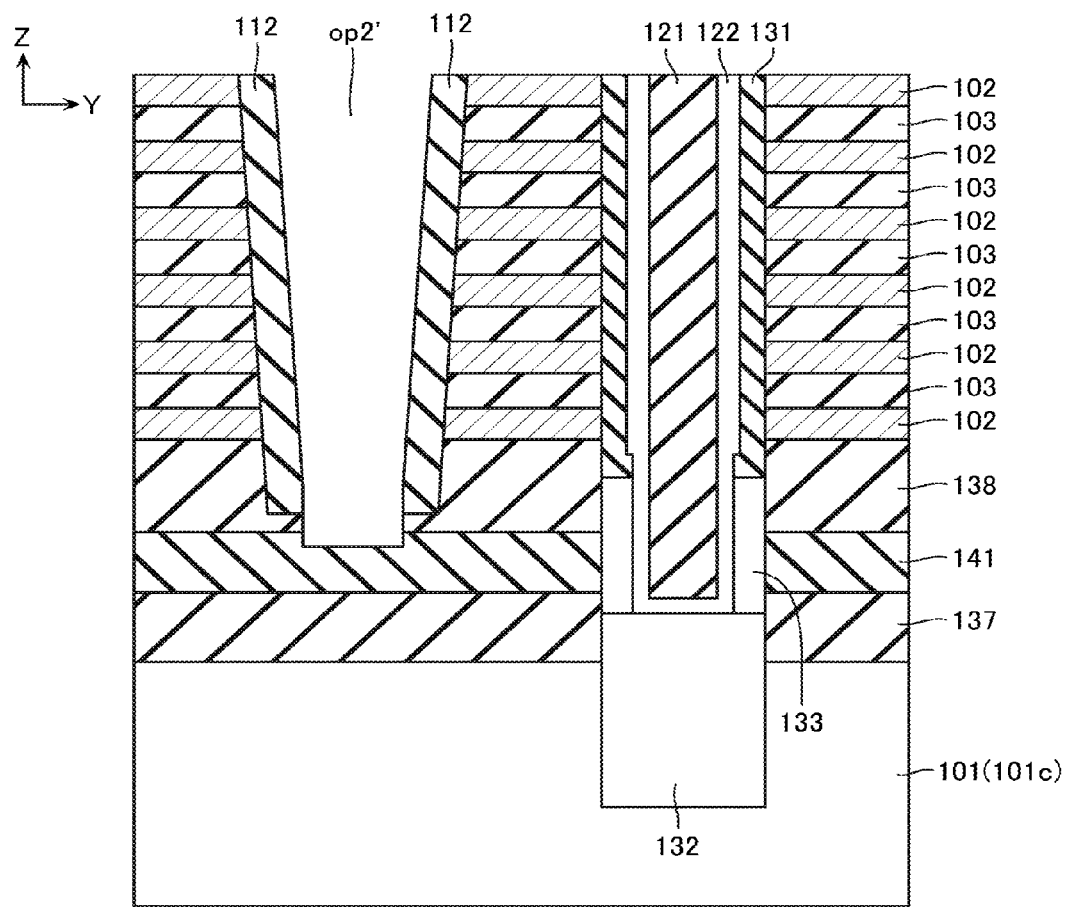

As shown in FIGS. 24, 29, and 30, in step S208, the spacer insulating layer 112 is formed.

For example, as shown in FIG. 29, in step S208, an insulating layer 112A forming the spacer insulating layer 112, is formed. The insulating layer 112A is formed by depositing silicon oxide (SiO$_2$) on a side surface and bottom surface of the opening op2', for example. Film formation of silicon oxide is performed by a method such as CVD, for example.

Moreover, as shown in FIG. 30, in step S208, a portion covering the bottom surface of the opening op2', of the insulating layer 112A is removed, and furthermore, a part of the inter-layer insulating layer 138 is removed, whereby the upper surface of the sacrifice layer 141 is exposed. A portion formed on the side surface of the opening op2', of the insulating layer 112A is left unremoved and becomes the spacer insulating layer 112. Note that this step is performed by a means such as RIE, for example.

Figure 31:
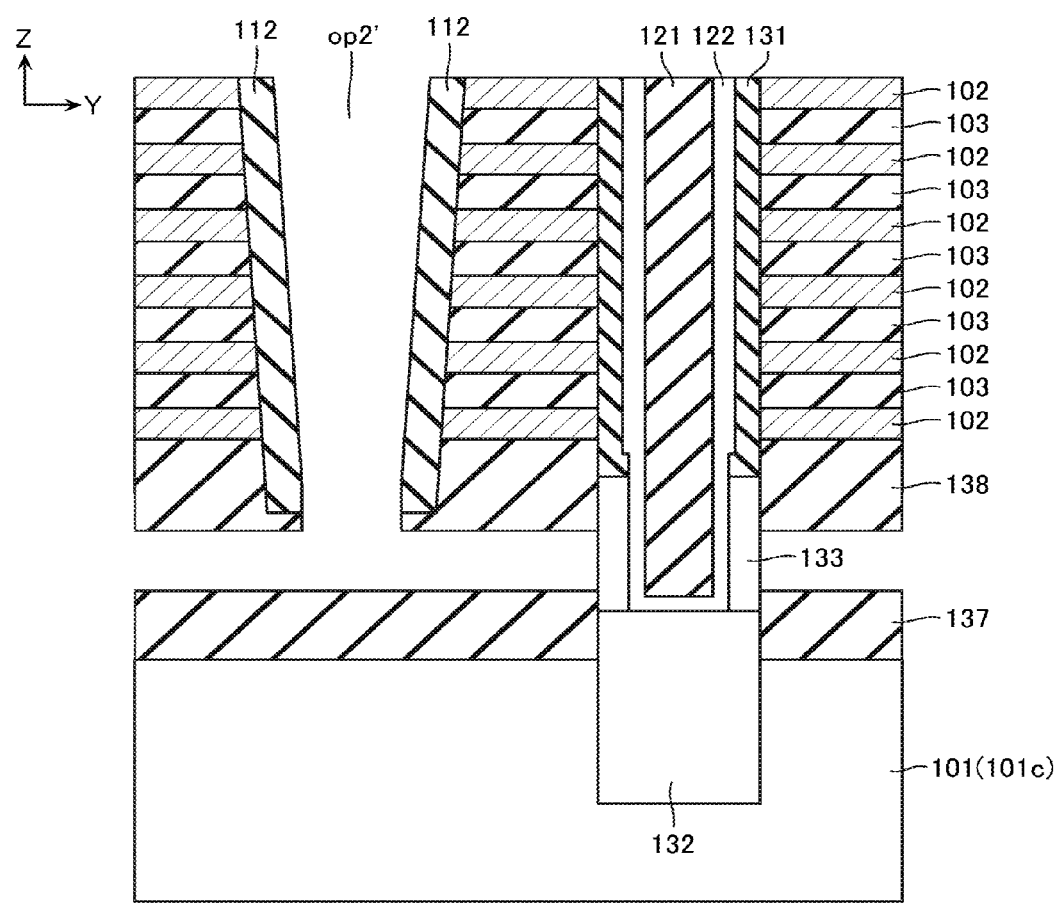

As shown in FIGS. 24, 31, and 23, in step S209, the contact 208 functioning as the source contact LI and the second conductive layer 136 are formed.

For example, as shown in FIG. 31, in step S209, the lowermost layer sacrifice layer 141 is removed via the opening op2'. The sacrifice layer 141 is removed by the likes of wet etching using phosphoric acid, for example.

Moreover, as shown in FIG. 23, in step S209, the barrier metal layer 208b and the first portion 208a of the contact 208, and the second conductive layer 136 are formed. The barrier metal layer 208b and the first portion 208a are formed by sequentially depositing titanium nitride (TiN) and tungsten (W) on a side surface of the spacer insulating layer 112, an upper surface of the inter-layer insulating layer 137, a lower surface of the inter-layer insulating layer 138, and a side surface of the memory columnar body 105, via the opening op2', for example. Film formation of titanium nitride and tungsten is performed by a method such as CVD, for example.

Other Embodiments

Figure 32:
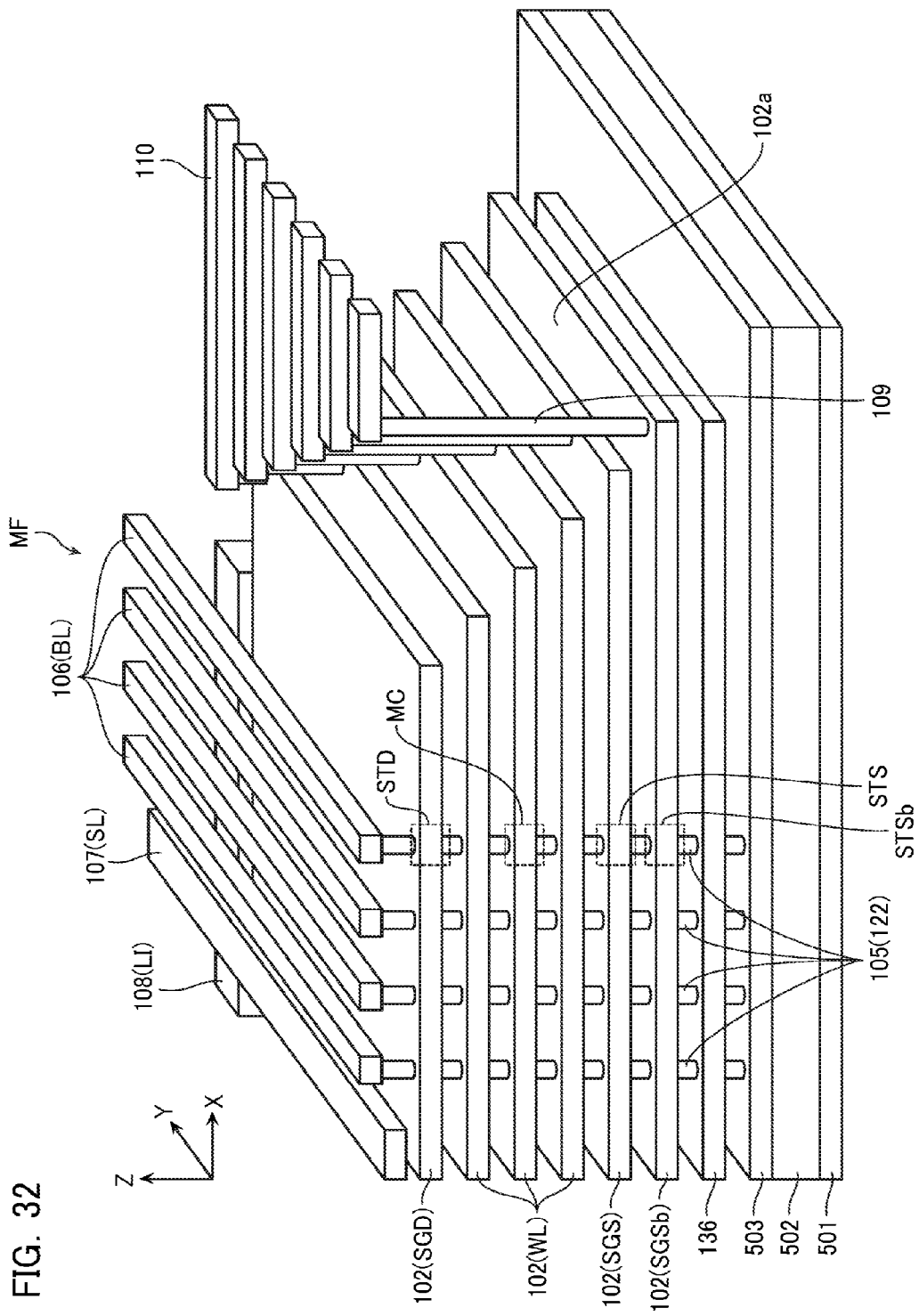
FIG. 32 is a perspective view showing a configuration of part of a nonvolatile semiconductor memory device according to another embodiment.

As shown in FIG. 3, in the first and second embodiments, the substrate 101 includes the P type impurity layer 101c, and the lower end of the memory columnar body 105 contacts this P type impurity layer 101c. However, the lower ends of the memory columnar body 105 and the contact 108 may be connected by the likes of a semiconductor layer provided upwardly of the substrate. In the example shown in FIG. 32, for example, a circuit layer 502 and a semiconductor layer 503 (first semiconductor layer) are provided between a substrate 501 and the second conductive layer 136. The substrate 501 is a semiconductor substrate, for example. The circuit layer 502 includes the likes of a field effect transistor or a wiring line, for example. The semiconductor layer 503 is formed from a semiconductor such as polysilicon including a P type impurity, for example. Moreover, the semiconductor layer 503 is connected to the lower end of the memory columnar body 105.

Moreover, in the description above, the first semiconductor layer includes a P type impurity, and the third semiconductor layer includes an N type impurity. However, for example, the first semiconductor layer may include an N type impurity, and the third semiconductor layer may include a P type impurity.

Moreover, in the first and second embodiments, the contacts 108 and 208 functioning as the source contact LI comprise a substantially plate-like shape extending in the X direction and the Z direction. However, a shape of a conductive layer functioning as the source contact LI may be appropriately changed, and the contacts 108 and 208 may comprise a circular column shape extending in the Z direction, for example.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate;
   a plurality of first conductive layers stacked upwardly of the substrate;
   a memory columnar body extending in a first direction intersecting an upper surface of the substrate, a side surface of the memory columnar body being covered by the plurality of first conductive layers;
   a first semiconductor layer connected to a lower end of the memory columnar body, the first semiconductor layer extending in a second direction intersecting the first direction;
   a second conductive layer provided between the first semiconductor layer and the plurality of first conductive layers, the second conductive layer being connected to the memory columnar body and extending in the second direction; and
   a contact connected to the second conductive layer, the contact extending in the first direction,
   the memory columnar body comprising:
   a second semiconductor layer extending in the first direction, the second semiconductor layer facing the plurality of first conductive layers;
   a gate insulating layer covering a side surface of the second semiconductor layer; and
   a third semiconductor layer covering a side surface of a lower part of the second semiconductor layer,
   wherein the first semiconductor layer includes a P type impurity,
   the third semiconductor layer includes an N type impurity, and
   the second semiconductor layer is connected to the contact via the second conductive layer and the third semiconductor layer.

2. The semiconductor memory device according to claim 1, wherein
   the first semiconductor layer is a P type impurity layer provided in the upper surface of the substrate.

3. The semiconductor memory device according to claim 2, wherein
   the P type impurity includes boron (B).

4. The semiconductor memory device according to claim 1, wherein
   the N type impurity is at least one of phosphorus (P) and arsenic (As), and
   the P type impurity is boron (B).

5. The semiconductor memory device according to claim 1, wherein
   a concentration of impurity in the second semiconductor layer is lower than a concentration of impurity in the first semiconductor layer, and is lower than a concentration of impurity in the third semiconductor layer.

6. The semiconductor memory device according to claim 5, wherein
   the N type impurity is at least one of phosphorus (P) and arsenic (As), and
   the P type impurity is boron (B).

7. The semiconductor memory device according to claim 1, wherein
   the third semiconductor layer includes a monocrystal.

8. The semiconductor memory device according to claim 1, wherein
   an upper end of the contact is connected to a source line provided upwardly of the contact, and
   a lower end of the contact is connected to the first semiconductor layer.

9. The semiconductor memory device according to claim 1, wherein
   an upper end of the contact is connected to a source line provided upwardly of the contact, and a lower end of the contact is connected to the second conductive layer.

10. A semiconductor memory device, comprising:

a substrate;

a plurality of first conductive layers stacked upwardly of the substrate;

a memory columnar body extending in a first direction intersecting an upper surface of the substrate, a side surface of the memory columnar body being covered by the plurality of first conductive layers;

a first semiconductor layer connected to a lower end of the memory columnar body, the first semiconductor layer extending in a second direction intersecting the first direction;

a second conductive layer provided between the first semiconductor layer and the plurality of first conductive layers, the second conductive layer being connected to the memory columnar body and extending in the second direction; and a contact connected to the second conductive layer, the contact extending in the first direction, the memory columnar body comprising:

a second semiconductor layer extending in the first direction, the second semiconductor layer facing the plurality of first conductive layers;

a third semiconductor layer covering a side surface of a lower part of the second semiconductor layer; and a fourth semiconductor layer connected to the first semiconductor layer and a lower end of the second semiconductor layer, and the second semiconductor layer being connected to the contact via the second conductive layer and the third semiconductor layer.

11. The semiconductor memory device according to claim 10, wherein the first semiconductor layer includes a P type impurity, and the third semiconductor layer includes an N type impurity.

12. The semiconductor memory device according to claim 11, wherein the N type impurity is at least one of phosphorus (P) and arsenic (As), and the P type impurity is boron (B).

13. The semiconductor memory device according to claim 11, wherein a concentration of impurity in the second semiconductor layer is lower than a concentration of impurity in the first semiconductor layer, and is lower than a concentration of impurity in the third semiconductor layer.

14. The semiconductor memory device according to claim 13, wherein the N type impurity is at least one of phosphorus (P) and arsenic (As), and the P type impurity is boron (B).

15. The semiconductor memory device according to claim 10, wherein the third semiconductor layer and the fourth semiconductor layer include a monocrystal.

16. The semiconductor memory device according to claim 10, wherein an upper end of the contact is connected to a source line provided upwardly of the contact, and a lower end of the contact is connected to the first semiconductor layer.

17. The semiconductor memory device according to claim 10, wherein an upper end of the contact is connected to a source line provided upwardly of the contact, and a lower end of the contact is connected to the second conductive layer.

18. The semiconductor memory device according to claim 10, further comprising a first insulating layer provided between a plurality of the first conductive layers and the contact, wherein the contact comprises: a first portion extending in the first direction; and a second portion provided between this first portion and the first semiconductor layer, a lower end of the first insulating layer is positioned more upwardly than an upper surface of the first semiconductor layer, and a side surface of the second portion of the contact contacts the first semiconductor layer at a height position of the upper surface of the first semiconductor layer.

19. A semiconductor memory device, comprising:

a substrate;

a plurality of first conductive layers stacked upwardly of the substrate;

a memory columnar body extending in a first direction intersecting an upper surface of the substrate, a side surface of the memory columnar body being covered by the plurality of first conductive layers;

a first semiconductor layer connected to a lower end of the memory columnar body, the first semiconductor layer extending in a second direction intersecting the first direction;

a second conductive layer provided between the first semiconductor layer and the plurality of first conductive layers, the second conductive layer being connected to the memory columnar body and extending in the second direction;

a contact connected to the second conductive layer, the contact extending in the first direction; and a first insulating layer provided between a plurality of the first conductive layers and the contact, wherein the contact comprises: a first portion extending in the first direction; and a second portion provided between this first portion and the first semiconductor layer, a lower end of the first insulating layer is positioned more upwardly than an upper surface of the first semiconductor layer, and a side surface of the second portion of the contact contacts the first semiconductor layer at a height position of the upper surface of the first semiconductor layer.

20. The semiconductor memory device according to claim 19, wherein the first semiconductor layer is a P type impurity layer provided in the upper surface of the substrate.

21. The semiconductor memory device according to claim 20, wherein the P type impurity includes boron (B).

22. The semiconductor memory device according to claim 19, wherein the memory columnar body comprises:

a second semiconductor layer extending in the first direction, the second semiconductor layer facing the plurality of first conductive layers;

a gate insulating layer covering a side surface of the second semiconductor layer; and a third semiconductor layer covering a side surface of a lower part of the second semiconductor layer, wherein the first semiconductor layer includes a P type impurity, the third semiconductor layer includes an N type impurity, and the second semiconductor layer is connected to the contact via the second conductive layer and the third semiconductor layer.

23. The semiconductor memory device according to claim 22, wherein the N type impurity is at least one of phosphorus (P) and arsenic (As), and the P type impurity is boron (B).

24. The semiconductor memory device according to claim 22, wherein a concentration of impurity in the second semiconductor layer is lower than a concentration of impurity in the first semiconductor layer, and is lower than a concentration of impurity in the third semiconductor layer.

25. The semiconductor memory device according to claim 24, wherein the N type impurity is at least one of phosphorus (P) and arsenic (As), and the P type impurity is boron (B).

26. The semiconductor memory device according to claim 22, wherein the third semiconductor layer includes a monocrystal.

27. The semiconductor memory device according to claim 19, wherein an upper end of the contact is connected to a source line provided upwardly of the contact, and a lower end of the contact is connected to the first semiconductor layer.

28. The semiconductor memory device according to claim 19, wherein an upper end of the contact is connected to a source line provided upwardly of the contact, and a lower end of the contact is connected to the second conductive layer.

* * * * *